(12) United States Patent
Lee et al.

(10) Patent No.: US 12,112,829 B2
(45) Date of Patent: Oct. 8, 2024

(54) MEMORY ARRAY CIRCUITS, MEMORY STRUCTURES, AND METHODS FOR FABRICATING A MEMORY ARRAY CIRCUIT

(71) Applicant: Taiwan Semiconductor Manufacturing Company, Ltd., Hsinchu (TW)

(72) Inventors: Chun-Ying Lee, Hsinchu (TW); Chia-En Huang, Xinfeng Township, Hsinchu County (TW); Meng-Sheng Chang, Chu-bei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/575,397

(22) Filed: Jan. 13, 2022

(65) Prior Publication Data
US 2023/0162768 A1    May 25, 2023

Related U.S. Application Data

(60) Provisional application No. 63/264,517, filed on Nov. 24, 2021.

(51) Int. Cl.
| | |
|---|---|
| *G11C 7/14* | (2006.01) |
| *G11C 7/18* | (2006.01) |
| *H01L 25/065* | (2023.01) |
| *H10B 12/00* | (2023.01) |

(52) U.S. Cl.
CPC ............... *G11C 7/14* (2013.01); *G11C 7/18* (2013.01); *H01L 25/0655* (2013.01); *H10B 12/056* (2023.02); *H10B 12/36* (2023.02)

(58) Field of Classification Search
CPC ......... G11C 7/14; G11C 7/18; H01L 25/0655; H10B 12/056; H10B 12/36
USPC ........................................................ 365/244
See application file for complete search history.

(56) References Cited

U.S. PATENT DOCUMENTS

| | | | | |
|---|---|---|---|---|
| 7,913,215 B2 * | 3/2011 | Chou | ...................... | G06F 30/30 716/118 |
| 2005/0044522 A1 * | 2/2005 | Maeda | .............. | H01L 27/11803 430/5 |
| 2015/0091188 A1 * | 4/2015 | Lee | ................. | H01L 21/823821 257/774 |

FOREIGN PATENT DOCUMENTS

JP        H07176631 A   *   7/1995

* cited by examiner

*Primary Examiner* — Huan Hoang
(74) *Attorney, Agent, or Firm* — Finnegan, Henderson, Farabow, Garrett & Dunner, L.L.P.

(57) ABSTRACT

A memory array circuit includes a memory array and a set of dummy cells surrounding the memory array. The first memory array includes a first set of memory cells located in an inner area of the memory array and a second set of memory cells located along an edge of the memory array. Each dummy cell includes one or more active regions and multiple gate structures over the one or more active regions.

20 Claims, 19 Drawing Sheets

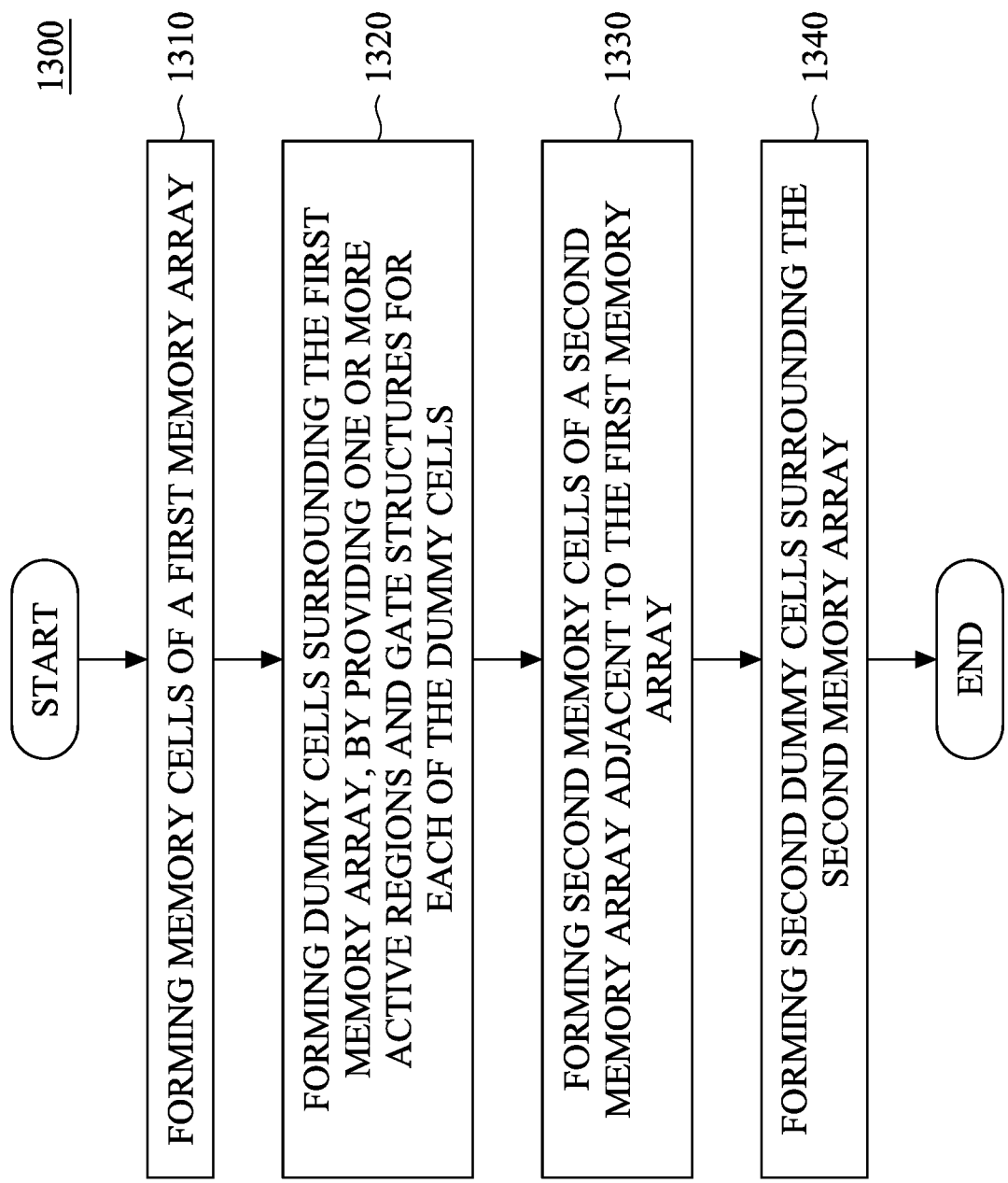

MEMORY ARRAY CIRCUITS, MEMORY STRUCTURES, AND METHODS FOR FABRICATING A MEMORY ARRAY CIRCUIT

REFERENCE TO RELATED APPLICATION

This application claims priority of U.S. Provisional Application No. 63/264,517, filed on Nov. 24, 2021, entitled "MEMORY ARRAY CIRCUITS, MEMORY STRUCTURES, AND METHODS FOR FABRICATING A MEMORY ARRAY CIRCUIT," the entirety of which is incorporated by reference herein.

BACKGROUND

Memory circuits, include dynamic random-access memory ("DRAM"), static random-access memory ("SRAM"), or non-volatile memory ("NVM") circuits have been used in various applications. For example, integrated circuits (ICs) sometimes include one-time-programmable (OTP) memory elements, in which data is written once and is non-volatile upon loss of power. The memory circuits include memory cells arranged in arrays. The memory cells are typically accessed through a bit line (BL) associated with a column of the array and a word line (WL) associated with a row of the array. In some highly integrated devices, embedded memory arrays are provided as part of an integrated circuit that may include circuits and components for additional functionality. For example, system-on-chip ("SoC") devices may include a processor, program memory, data storage memory, and other functions needed for implementing a system solution.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

FIG. 13 is a flowchart of a method for fabricating a memory array circuit, in accordance with some embodiments of the present disclosure.

DETAILED DESCRIPTION

Figure 1A:
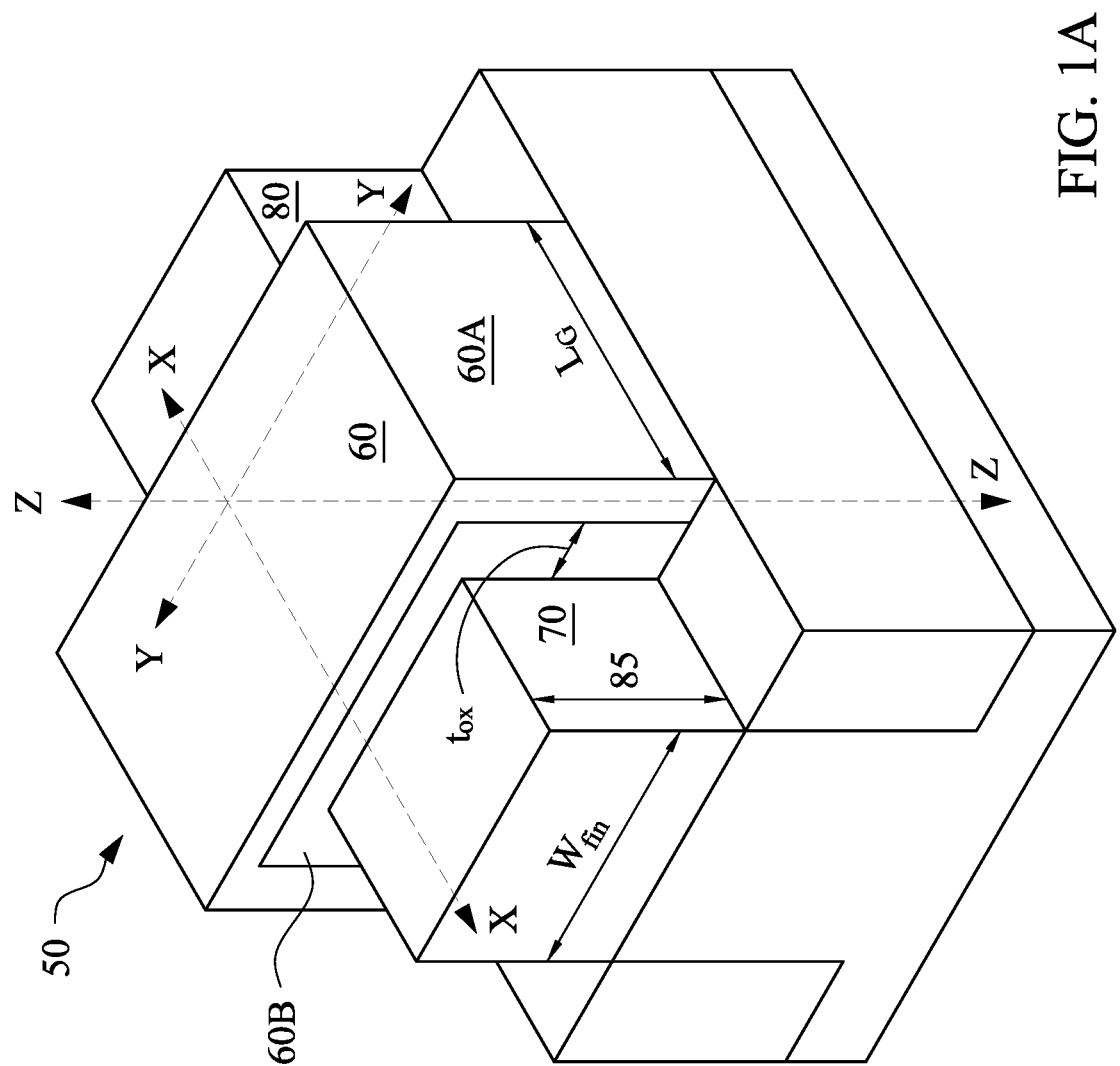
FIG. 1A illustrates a perspective view of an exemplary FinFET device, in accordance with some embodiments of the present disclosure.

The following disclosure provides many different exemplary embodiments, or examples, for implementing different features of the presently disclosed subject matter. Specific simplified examples of components and arrangements are described below to explain the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Various embodiments of the present disclosure will be described with respect to embodiments in a specific context, namely a one-time-programmable (OTP) memory, which is a type of non-volatile memory (NVM) that permits data to be written to memory once. Once the memory has been programmed, the OTP memory retains its value upon loss of power. The concepts in the disclosure may also apply, however, to other semiconductor memory structures or circuits. The present disclosure is related to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed. Various field effect transistor (FET) devices, including gate-all-around (GAA) FETs, GAA FinFETs, planar FETs, or other traditional Metal-Oxide Semiconductor Field Effect Transistor (MOSFET) devices, may also be used in various embodiments of the present disclosure.

The use of FinFET devices has been gaining popularity in the semiconductor industry. FIG. 1A illustrates a perspective view of an exemplary FinFET device 50, in accordance with some embodiments of the present disclosure. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1A. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric component 60B has a thickness tox measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin about which the gate 60 is wrapped serves as a channel of the FinFET device 50. The effective channel length of the FinFET device 50 is determined by the dimensions of the fin.

Figure 1B:
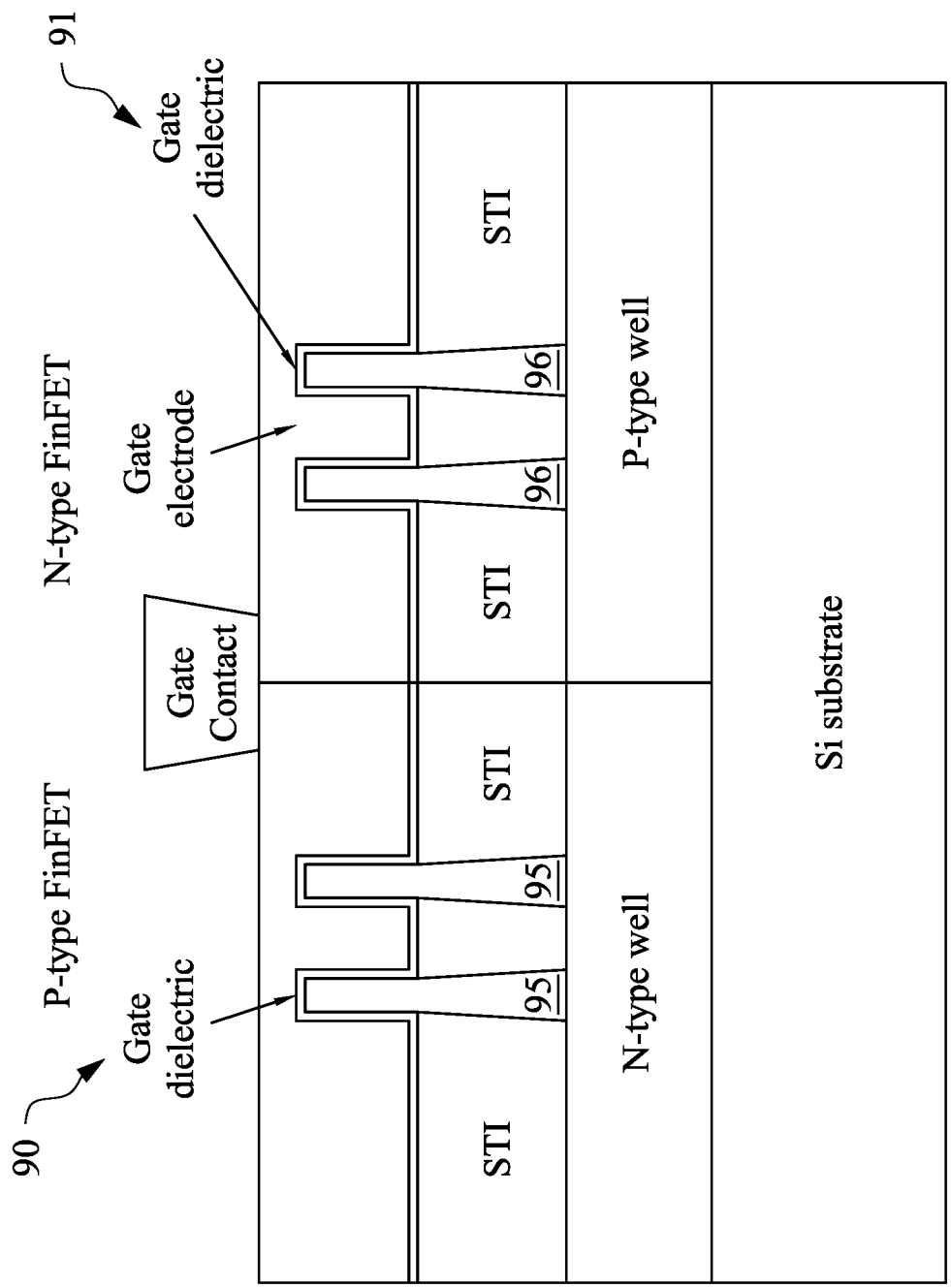
FIG. 1B illustrates a cross-sectional side view of FinFET transistors in a CMOS configuration, in accordance with some embodiments of the present disclosure.

FIG. 1B illustrates a cross-sectional side view of FinFET transistors taken along a section line Y-Y in the Y-direction of FIG. 1A in a CMOS configuration, in accordance with some embodiments of the present disclosure. The CMOS FinFET includes a substrate, for example a silicon (Si) substrate. An N-type well and a P-type well are formed in the substrate. A dielectric isolation structure such as a shallow trench isolation (STI) is formed over each of the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95 and 96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate. FinFET devices may offer several advantages, such as better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Figure 2:
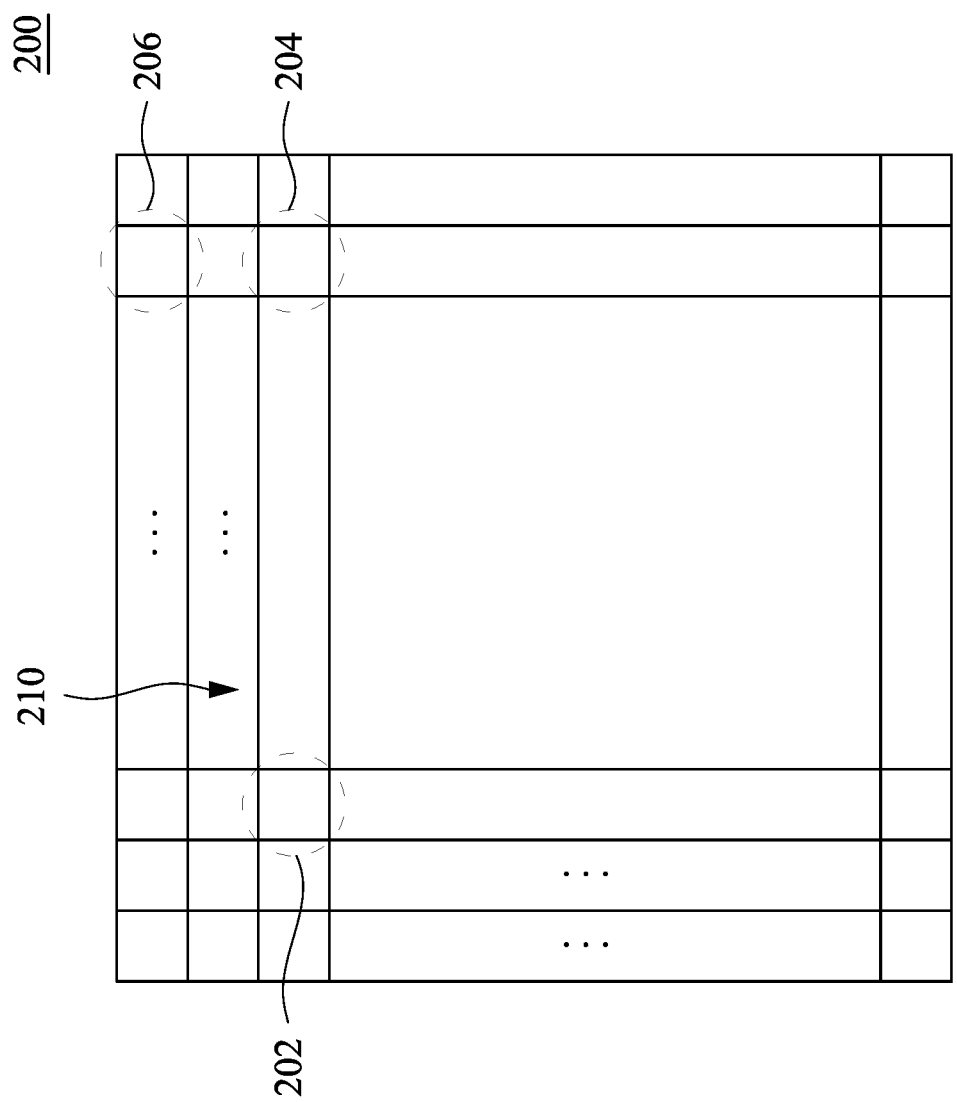
FIG. 2 illustrates an exemplary memory array circuit, in accordance with some embodiments of the present disclosure.

FIG. 2 illustrates an exemplary memory array circuit 200 in accordance with some embodiments of the present disclosure. The memory array circuit 200 may be provided using FinFET device 50 shown in FIG. 1A and FIG. 1B for transistors within memory cells 202 and 204. As shown in FIG. 2, the memory array circuit 200 includes a memory array 210 with memory cells 202 and 204 at intersections of rows and columns. The memory array circuit 200 can be a non-volatile memory, such as an OTP memory, but the present disclosure is not limited thereto. In some other embodiments, the memory array circuit 200 may be dynamic random-access memory ("DRAM"), static random-access memory ("SRAM"), or magnetoresistive random access memory (MRAM).

Particularly, the memory array circuit 200 includes a first set of memory cells 202 (hereinafter also referred to as "the inner memory cells") and a second set of memory cells 204 (hereinafter also referred to as "the edge memory cells") as part of the memory array 210, and a set of dummy cells 206 (hereinafter also referred to as "the dummy cells"). Each memory cell 202 or 204 includes a predetermined number of transistors for performing memory functions, which will be discussed in detail below.

Memory cells 202 are disposed at an inner area of the memory array 210. Memory cells 204 are located at one or more edges of the memory array 210, surrounding the inner cells. In some embodiments, a corresponding column decoder, a sense amplifier, and a row decoder (not shown) are located at the end of columns and rows of the memory array 210 for selecting a target memory cell for a read, write, or erase operation. The embodiments of the present disclosure allow the memory array circuit 200 to sustain process variations caused by plasma etching or chemical mechanical polishing during the fabrication stage, and to improve the yield of memory cells and the read/write performance. This is achieved by, for example, the arrangement of the dummy cells 206, which may be inoperative cells surrounding the memory array 210 and configured to provide a margin to prevent potential under-etching or over-etching issues within the memory array 210 having operative cells.

In some embodiments, the inner memory cells 202 are designed to be regular cells. For example, the inner memory cells 202 may have identical physical dimensions, construction rules, and operation conditions. In some embodiments, the edge memory cells 204 are designed to be irregular cells. For example, the edge memory cells 204 may differ from the inner memory cells 202 in physical dimensions, construction rules, or operation conditions. The irregular edge memory cells 204 allow the pattern at the edge of the memory array 210 to be different from that at the inner area thereof. Thus, the etch rate at the edge can be adjusted by appropriately designing the physical dimensions of the edge memory cells 204. In some other embodiments, the edge memory cells 204 may be designed to be regular cells, having physical dimensions, construction rules, and operation conditions identical to that of the inner memory cells 202.

While in FIG. 2, each of the top, bottom, left, and right edges of the memory array 210 includes a single row or column of edge memory cells 204. The number of the rows and columns of the edge memory cells 204 can vary. For example, multiple adjacent rows or multiple adjacent columns of edge memory cells 204 can be arranged at any of the top, bottom, left, and right edges as long as they satisfy design requirements.

In some embodiments, edge memory cells 204 are operative, and operate under one or more conditions, such as well bias, well pick-up bias, and ground-node bias, which are independent from conditions for the inner memory cells 202. The edge memory cells 204 can be designed with relaxed design rules, such that the electronic components in the edge memory cells 204 will be stronger than those in the inner memory cells 202. For example, a channel length or width of a transistor in the edge memory cells 204 can be larger than that of a transistor in the inner memory cells 202 by 5%, or any other suitable value.

As shown in FIG. 2, the set of dummy cells 206 are arranged to surround the memory array 210. In some embodiments, the dummy cells 206 are designed in several ways to be inoperative cells. For example, the dummy cells 206 can be designed to omit at least one layer necessary for the dummy cell to be operative. In some other embodiments, the dummy cells 206 are designed to omit at least one electronic component, such as a pass gate transistor, pull-down device, and pull-up device, which is necessary for the dummy cell to be operative. Alternatively, the dummy cells 206 can be constructed in the same way as the inner memory cells 202 or the edge memory cells 204 but are disabled from carrying out their functions. The inoperative dummy cells 206 strengthen the robustness at the edge of the memory array 210, as explained below.

Figure 3A:
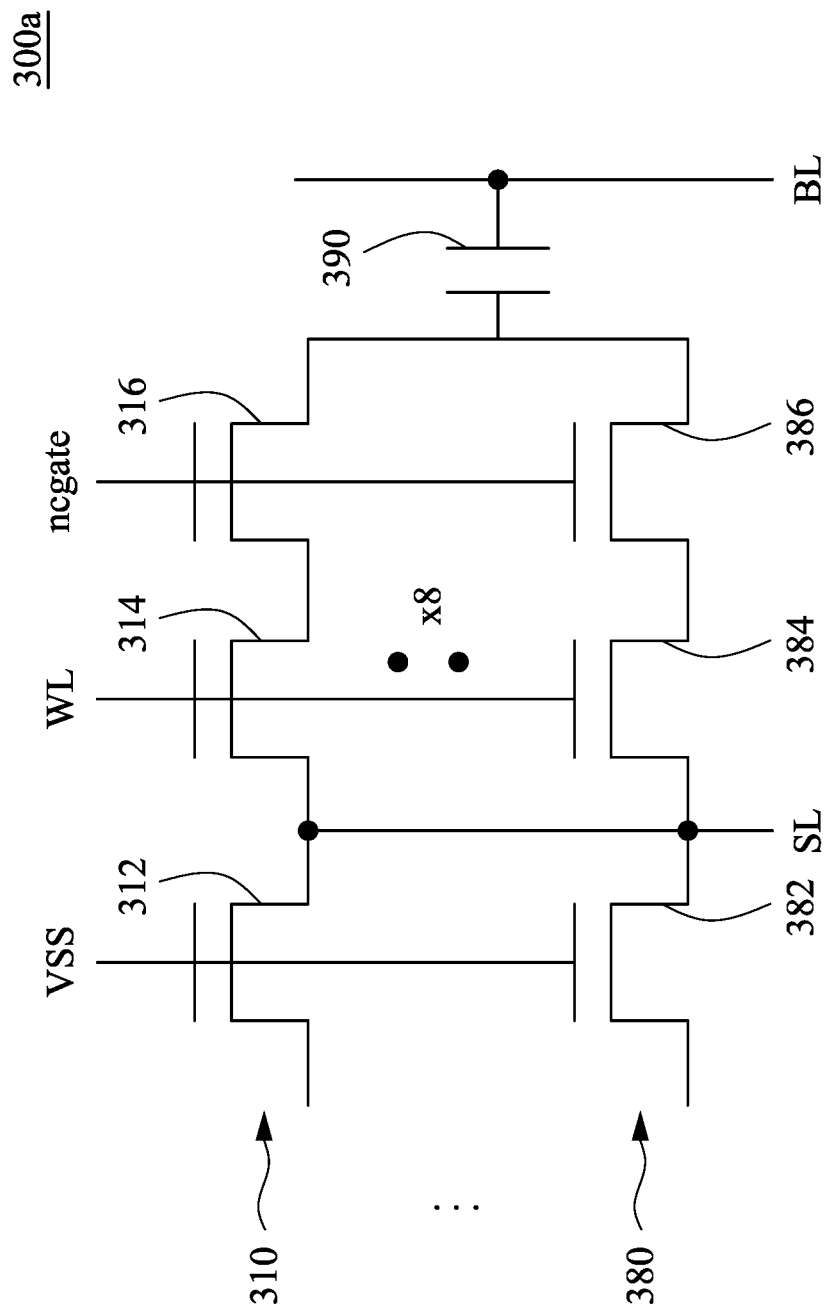
FIG. 3A is a diagram illustrating a first exemplary circuit diagram of a memory cell, in accordance with some embodiments of the present disclosure.

FIG. 3A is a diagram illustrating an exemplary circuit diagram of a memory cell 300a, in accordance with some embodiments of the present disclosure. In some embodiments, the inner memory cells 202 and the edge memory cells 204 may be formed by the memory cell 300a in FIG. 3A. In some embodiments, the memory cell 300a may be used to implement an OTP bit cell with inhibit select lines. As shown in FIG. 3A, in some embodiments, the memory cell 300a includes multiple units 310-380 coupled in parallel. For example, the unit 310 includes transistors 312, 314, and 316 coupled in series. The unit 380 includes transistors 382, 384, and 386 coupled in series. In some embodiments, the number of units arranged within the memory cell 300a is eight as shown in FIG. 3A, but the present disclosure is not limited thereto. For example, the number of units arranged within the memory cell 300a may be four or sixteen, or any other practical number.

In the unit 310, a gate terminal of the transistor 312 is coupled to a power supply line VSS of a memory array circuit, e.g., circuit 200, a gate terminal of the transistor 314 is coupled to a word line WL of the memory array circuit, and a gate terminal of the transistor 316 is coupled to a negative control line NCGATE of the memory array circuit. Similarly, in the unit 380, a gate terminal of the transistor 382 is coupled to the power supply line VSS, a gate terminal of the transistor 384 is coupled to the word line WL, and a gate terminal of the transistor 386 is coupled to the negative control line NCGATE. The power supply line VSS, the word line WL and the negative control line NCGATE are associated with the memory cell 300a. Alternatively stated, in each of the units within the memory cell 300a, the power supply line VSS, the word line WL, and the negative control line NCGATE are respectively coupled to corresponding transistors for the memory operations. A capacitor 390 is coupled between a bit line BL of the memory array circuit, and a node coupled to the transistors 316, ..., 386 having their gate terminals coupled to the negative control line NCGATE for receiving a control signal. A select line SL is coupled to nodes between the transistors 312 ..., 382 and 314 ..., 384, respectively.

Figure 3B:
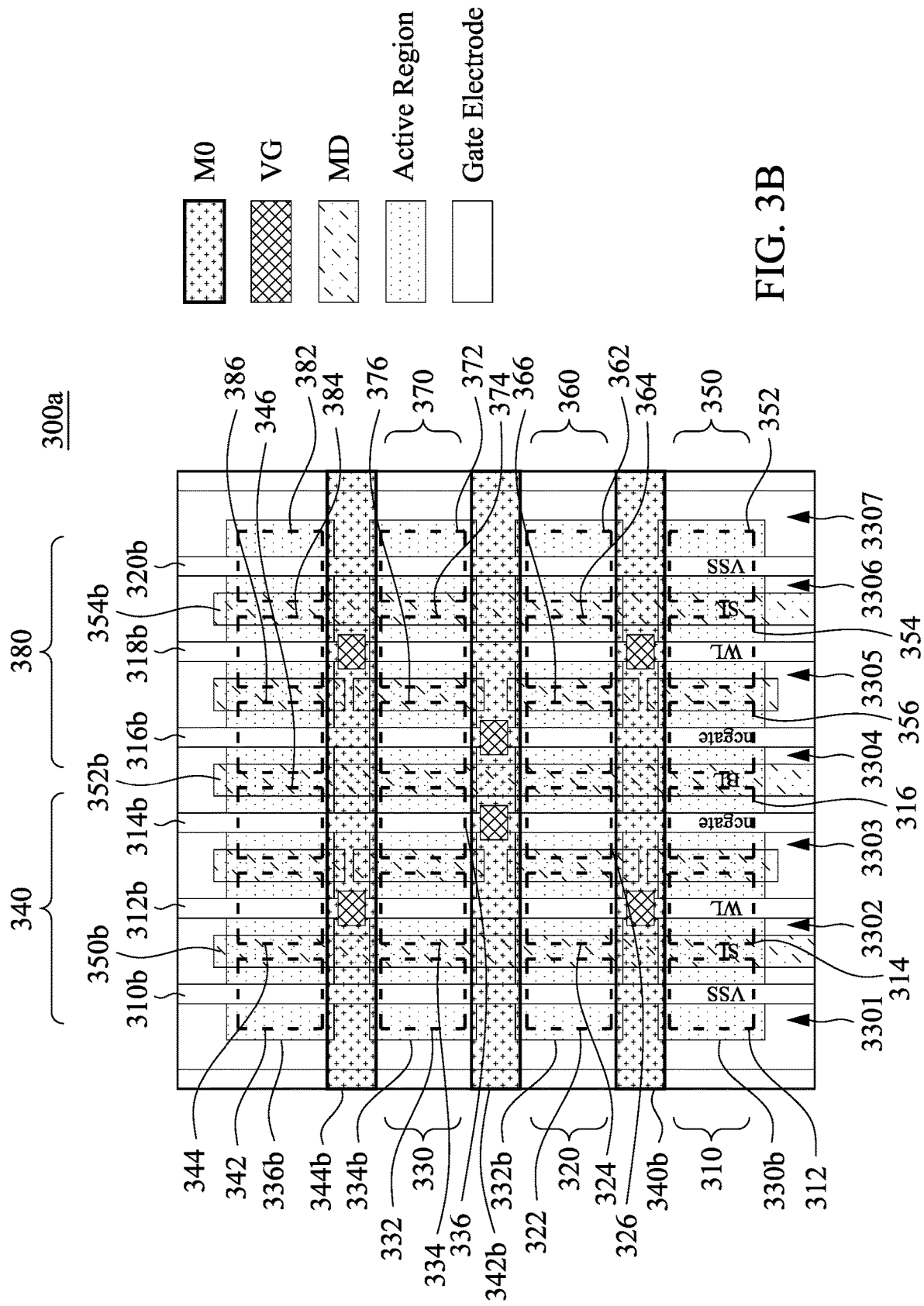
FIG. 3B is an exemplary layout diagram of the memory cell of FIG. 3A, in accordance with some embodiments of the present disclosure.

FIG. 3B is an exemplary layout diagram of the memory cell 300a in FIG. 3A, in accordance with some embodiments of the present disclosure. With respect to the embodiments of FIG. 3A, like elements in FIG. 3B are designated with the same reference numbers for ease of understanding. Components of the memory cell 300a in FIG. 3B, as will be illustrated below, are disposed, in some embodiments, over a semiconductor substrate, which, for convenience of illustration, is not shown in FIG. 3B. In some embodiments, the semiconductor substrate is a silicon substrate or other suitable semiconductor substrate.

For illustration in FIG. 3B, each of the transistors 312, ..., 382, 314, ..., 384 and 316, ..., 386 of the memory cell 300a is illustrated within a dashed line frame. The memory cell 300a includes gate electrodes 310b, 312b, 314b, 316b, 318b, 320b, arranged to form gates of the transistors 312-342, 314-344, 316-346, 356-386, 354-384, and 352-382. In some embodiments, the gate electrodes 310b, 312b, 314b, 316b, 318b, 320b may be polysilicon gates, but the present disclosure is not limited thereto.

As shown in FIG. 3B, active regions 330b, 332b, 334b, and 336b are provided within an Oxide Definition ("OD") layer along a first direction. In at least one example, the term "oxide-definition (OD)" refers to an active region for a transistor, i.e., the area where a source, a drain, and a channel under a gate of the transistor are formed. In some examples, an OD region is between insulating regions. In some embodiments, the insulating regions are shallow trench isolation (STI), field oxide (FOX) areas, or other suitable electrically insulating structures. In some embodiments, the insulating regions are called inactive regions or isolation regions. In some embodiments, the active regions 330b, 332b, 334b, and 336b may include fin structures arranged as active regions of the semiconductor substrate and to form sources/drains of the transistors (e.g., transistors 312-316 and 322-326). The term "source/drain" is referred to as a region that is either a source region or a drain region, in the present disclosure.

Gate electrodes 310b, 312b, 314b, 316b, 318b, and 320b are provided within a gate electrode layer over the OD layer, along a second direction perpendicular to the first direction.

Gate electrodes 310b, 312b, 314b, 316b, 318b, and 320b are shown crossing active regions 330b, 332b, 334b, and 336b, which are also referred to herein as OD regions. The transistors (e.g., transistors 312, . . . , 382, 314, . . . , 384, and 316, . . . , 386) within the memory cell 300a may be formed at the crossing areas of gate electrodes 310b-320b and active regions 330b-336b. A gate dielectric material such as silicon dioxide, is formed over the OD layer and lies under the gate electrodes 310b, 312b, 314b, 316b, 318b, and 320b, but is not shown here for simplicity.

Various conductive materials may be used to form the gate electrodes 310b, 312b, 314b, 316b, 318b, and 320b. For example, in various embodiments, the gate electrodes 310b, 312b, 314b, 316b, 318b, and 320b are formed of metal, metal alloys, metal silicide, or the like.

As shown in the layout in FIG. 3B, a gate contact layer (also known as a via-on-gate layer) VG having conductive features is disposed over the gate electrode layer for electrically connecting the gate electrode layer to an upper-level layer such as a local connection layer M0. A fin connection layer MD for electrically connecting source/drain regions of the transistors is disposed over the active regions 330b, 332b, 334b, and 336b. In some embodiments, the local connection layer M0 is a metal layer.

For illustration, the active region 330b includes sections 3301-3307. The section 3301 corresponds to the first source/drain of the transistor 312, and the section 3302 corresponds to the second source/drain of the transistor 312. Accordingly, the sections 3301 and 3302, and the gate electrode 310b together correspond to the transistor 312. The section 3302 also corresponds to the first source/drain of the transistor 314, and the section 3303 corresponds to the second source/drain of the transistor 314. Accordingly, the sections 3302 and 3303, and the gate electrode 312b together correspond to the transistor 314. The section 3303 also corresponds to the first source/drain of the transistor 316, and the section 3304 corresponds to the second source/drain of the transistor 316. Accordingly, the sections 3303 and 3304, and the gate electrode 314b together correspond to the transistor 316.

The section 3304 also corresponds to the first source/drain of the transistor 356, and the section 3305 corresponds to the second source/drain of the transistor 356. Accordingly, the sections 3304 and 3305, and the gate electrode 316b together correspond to the transistor 356. The section 3305 also corresponds to the first source/drain of the transistor 354, and the section 3306 corresponds to the second source/drain of the transistor 354. Accordingly, the sections 3305 and 3306, and the gate electrode 318b together correspond to the transistor 354. The section 3306 also corresponds to the first source/drain of the transistor 352, and the section 3307 corresponds to the second source/drain of the transistor 352. Accordingly, the sections 3306 and 3307, and the gate electrode 320b together correspond to the transistor 352. Similarly, transistors 322-326, transistors 332-336, transistors 342-346, transistors 362-366, transistors 372-376 and transistors 382-386, in other units 320-340, 360-380 of the memory cell 300a may be formed at the intersections of gate electrodes 310b, 312b, 314b, 316b, 318b, and 320b and corresponding active regions 332b, 334b, and 336b.

In some embodiments, the gate electrodes 310b and 320b are electrically coupled to the power supply line VSS. The gate electrodes 312b and 318b are electrically coupled to the word line WL. The gate electrodes 314b and 316b are electrically coupled to the negative control line NCGATE. In some embodiments, the layer M0 includes conductive features 340b, 342b, and 344b.

As shown in FIG. 3B, the memory cell 300a may include one or more conductive layers (and one or more via layers) having one or more conductive features coupled to the transistor(s) formed by the active regions 330b-336b and the gate electrodes 310b-320b. In some embodiments, the gate electrodes 312b and 318b are electrically coupled to the conductive feature 340b of the layer M0 via corresponding vias in the layer VG and are electrically coupled to the conductive feature 344b of the layer M0 via corresponding vias in the layer VG. In some embodiments, the gate electrodes 314b and 316b are electrically coupled to the conductive feature 342b of the layer M0 via corresponding vias in the layer VG. In some embodiments, the fin connection layer MD includes conductive features 350b, 352b, and 354b. The conductive features 350b and 354b correspond to the select line SL, and the conductive features 352b corresponds to the bit line BL. In some embodiments, conductive features 350b, 352b, and 354b are provided within the fin connection layer MD along the second direction perpendicular to the first direction.

In some embodiments, based on the layout implementation in FIG. 3B, the gate electrodes 310b and 320b are connected to the power supply line VSS through interconnects and contacts in the memory cell 300a. The resistance corresponding to the connections of the gate electrodes 310b and 320b with the power supply line VSS are reduced by the connection of the interconnects, compared with other approaches using contacts outside the memory cell 300a. Moreover, the layout area may also be reduced, compared with other approaches using additional layout areas for the outside contacts which connect the gate electrodes 310b and 320b with the power supply line VSS.

Figure 4:
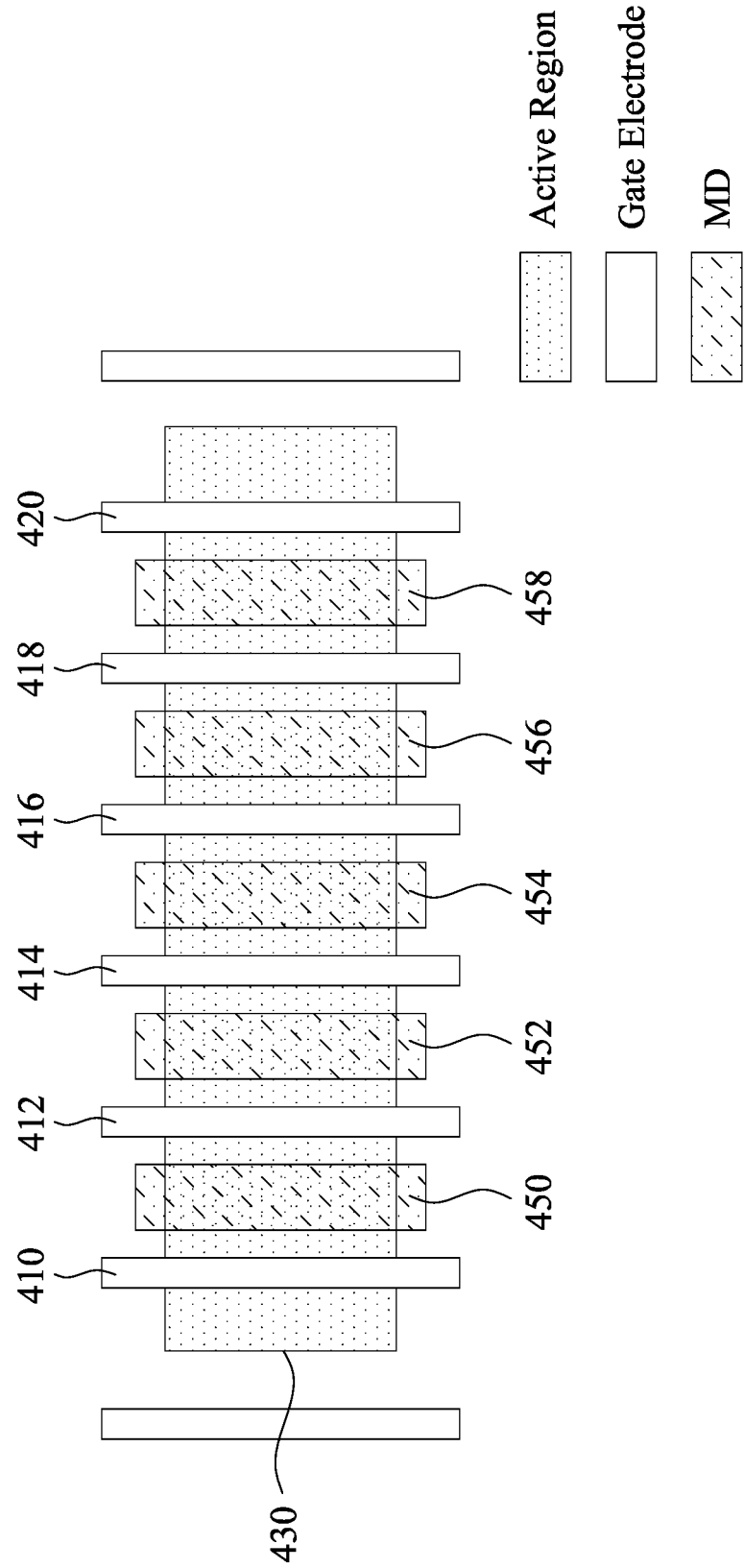
FIGS. 4-7 are exemplary layout diagrams of a dummy cell in the memory array circuit of FIG. 2, in accordance with some embodiments of the present disclosure.

FIG. 4 is an exemplary layout diagram of the dummy cell 206 in FIG. 2, in accordance with some embodiments of the present disclosure. The dummy cell 206 is formed in the gate electrode layer, the OD layer, and the fin connection layer MD described above. As shown in FIG. 4, in some embodiments, the dummy cell 206 includes gate electrodes 410, 412, 414, 416, 418, 420, in the gate electrode layer, to form dummy transistors in the dummy cell 206. In some embodiments, the gate electrodes 410, 412, 414, 416, 418, 420 may be polysilicon gates, but the present disclosure is not limited thereto.

Gate electrodes 410, 412, 414, 416, 418, and 420 are shown crossing an active region 430 in the OD layer, to form dummy transistor structures at the crossings. Accordingly, a bitcell-like dummy edge cell structure can be formed within the dummy cell 206. Similar to the memory cell 300a in FIG. 3B, a gate dielectric material such as silicon dioxide, is formed over the OD layer and lies under the gate electrodes 410, 412, 414, 416, 418, and 420, but is not shown for convenience of illustration.

In some embodiments, the dummy cell 206 also includes the fin connection layer MD for electrically connecting source/drain regions of the transistors. For example, as shown in FIG. 4, the fin connection layer MD includes one or more conductive features 450, 452, 454, 456, 458 over the active region 430. In various embodiments, the dummy cell 206 may also include other conductive layer(s) having one or more conductive features. The layout shown in FIG. 4 is merely an example and not meant to be limiting.

Figure 5:
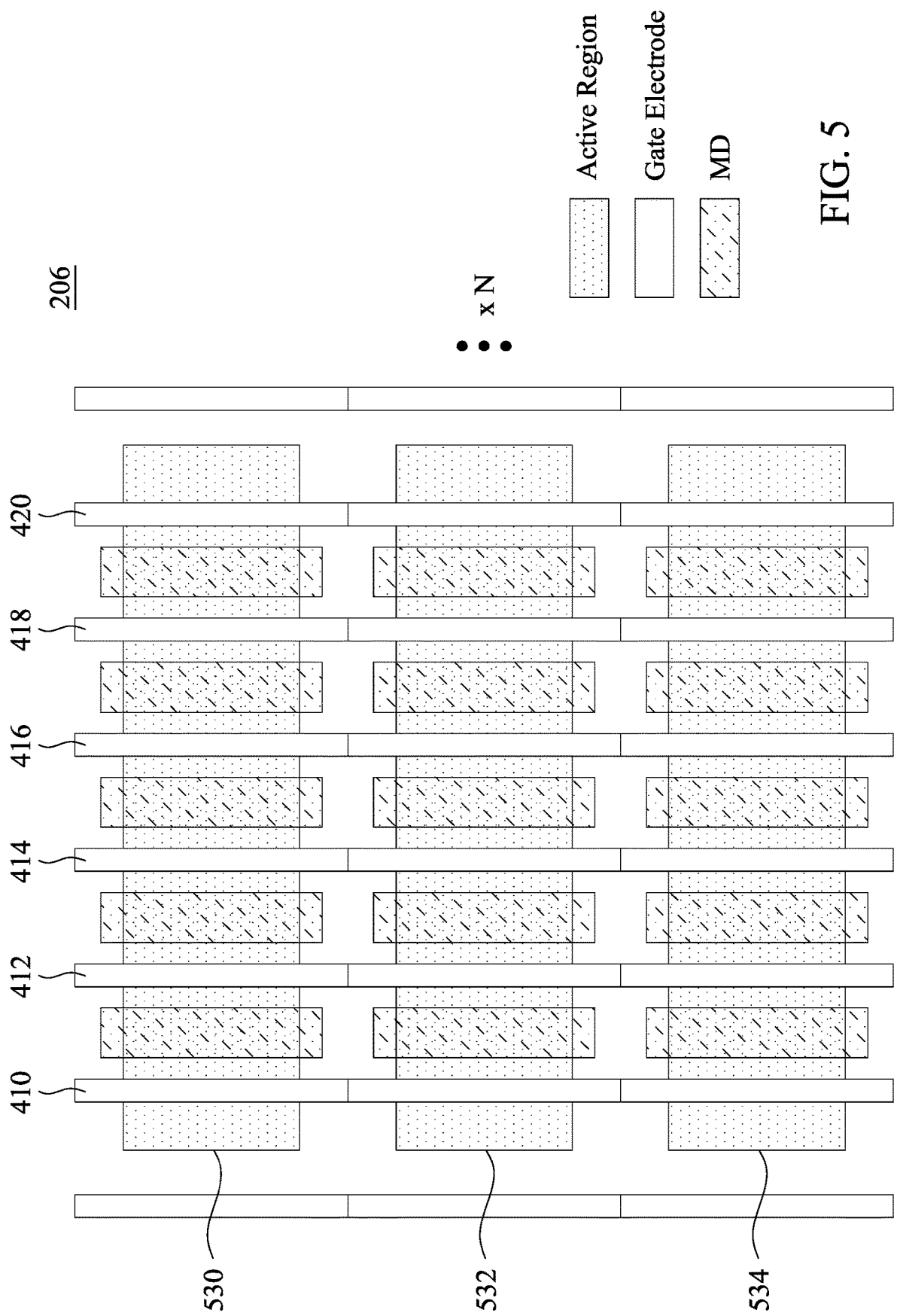

FIG. 5 is another exemplary layout diagram of the dummy cell 206 in FIG. 2, in accordance with some embodiments of the present disclosure. Compared to the layout shown in FIG. 4, in the embodiment of FIG. 5, the dummy cell 206 includes multiple active regions 530, 532, and 534 in the OD layer, and gate electrodes 410, 412, 414, 416, 418, and 420 cross each of the active regions 530, 532, and 534, forming transistors structures at the crossings. Accordingly, in some embodiments, the dummy cell 206 includes multiple rows and each row includes a unit of the layout shown in FIG. 4. Similar to FIG. 4, a bitcell-like dummy edge cell structure with multiple units having active regions 530, 532, and 534 disposed in different rows along the first direction can be formed within the dummy cell 206.

While three active regions 530, 532, and 534 are depicted in FIG. 5, the number of the rows and active regions within the dummy cell 206 may vary in different embodiments. The embodiment shown in FIG. 5 is exemplary and not meant to limit the present disclosure. In various embodiments, the number of the rows and active regions may depend on the specification or the requirement of the memory array circuit 200. By applying the layouts shown in FIG. 4 and FIG. 5, the process to form the edge memory cells 204 can be symmetric and the yield of the memory cells is thereby improved by using a part (e.g., one or more active regions with crossing gate electrodes) of a memory cell, but not a complete memory cell, in each of the bitcell-like dummy cells 206 around the edge memory cells 204.

Figure 6:
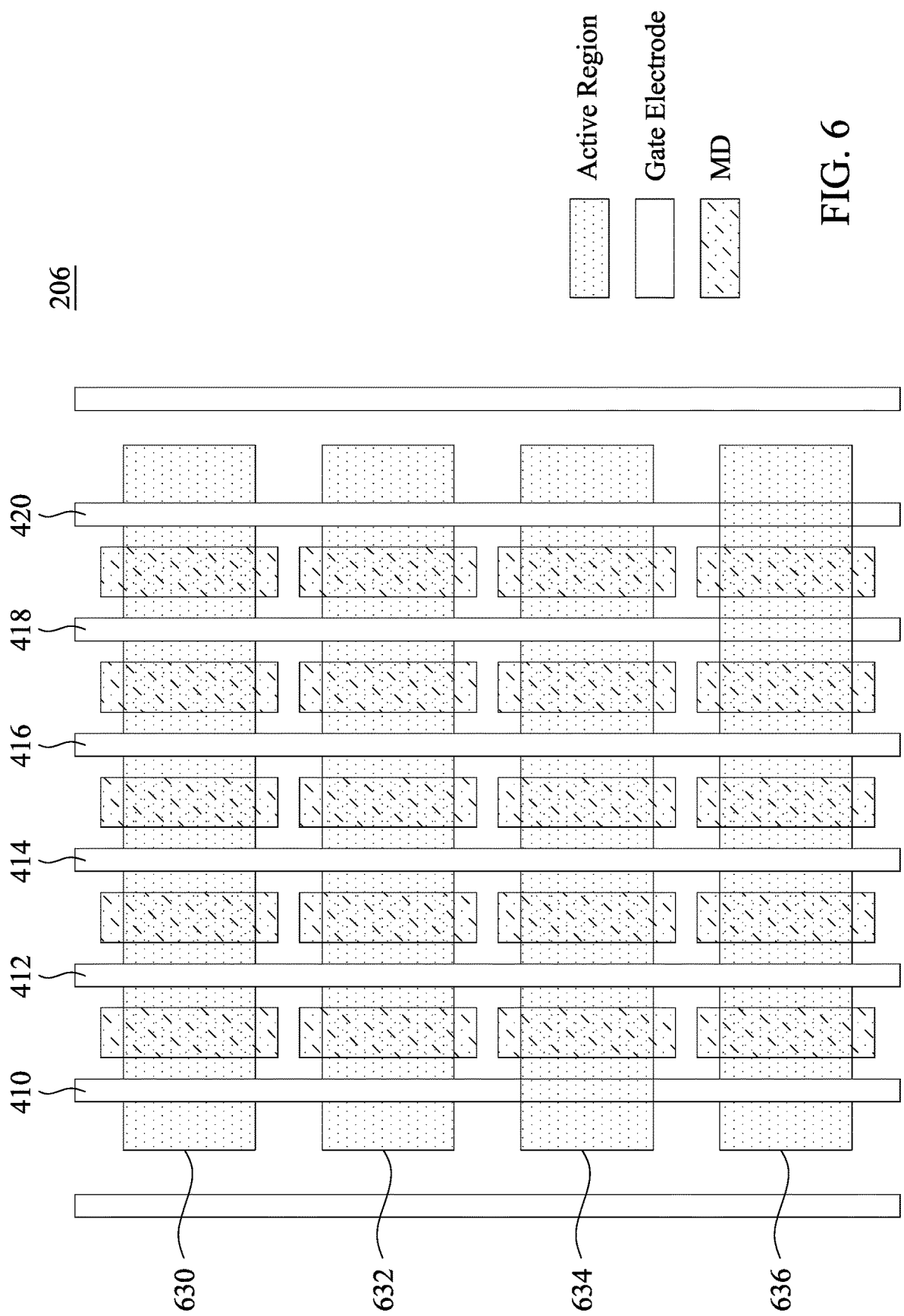

FIG. 6 is another exemplary layout diagram of the dummy cell 206 in FIG. 2, in accordance with some embodiments of the present disclosure. Compared to the layout shown in FIG. 4, in the embodiment of FIG. 6, the dummy cell 206 includes the same number of active regions 630, 632, 634 and 636, as the number of the active regions within one memory cell 202 or 204. Similarly, the dummy cell 206 includes the same number of the gate electrodes 410, 412, 414, 416, 418, and 420 crossing the active regions 630-636, as the number of the gate electrodes within one memory cell 202 or 204. For example, in some embodiments, the layout of the dummy cell 206 and the layout of the memory cells 202 or 204 may be identical within the OD layer and the gate electrode layer. In some embodiments, the layout within the fin connection layer MD may also be identical, but the present disclosure is not limited thereto. Alternatively stated, the dummy cell 206 may be a cell having the OD layer, the gate electrode layer, and the fin connection layer MD similar to those in a single memory cell within the memory array 210.

Figure 7:
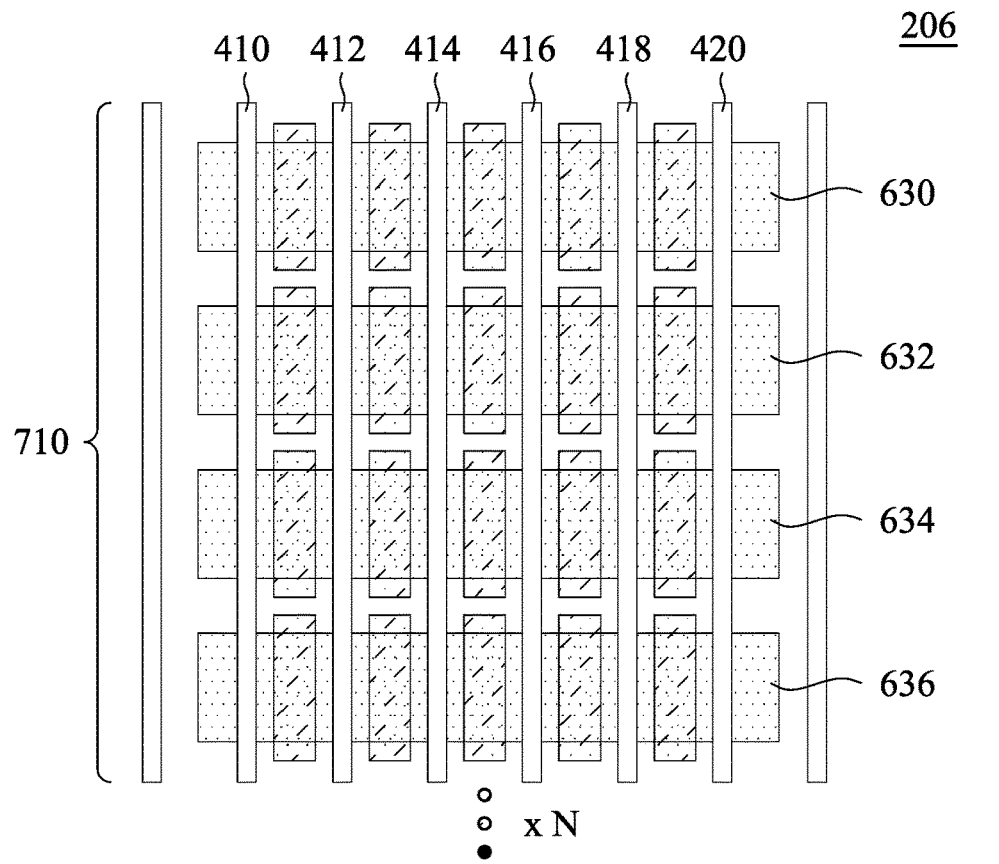

FIG. 7 is another exemplary layout diagram of the dummy cell 206 in FIG. 2, in accordance with some embodiments of the present disclosure. Compared to the layout shown in FIG. 6, in the embodiment of FIG. 7, the dummy cell 206 includes multiple units 710 and 720, and each unit 710 or 720 includes one cell shown in the layout of FIG. 6. It is noted that while the two units 710 and 720 are depicted in FIG. 7, the number of units within the single dummy cell 206 may vary in different embodiments. The embodiment shown in FIG. 7 is exemplary and not meant to limit the present disclosure. The number of the active regions within one dummy cell 206 may be a multiple of the number of the active regions within one memory cell 202 or 204. By applying the layouts shown in FIG. 6 and FIG. 7, the process for forming the edge memory cells 204 can be symmetric and the yield of the memory cells can thereby be improved by using one or more units having the OD layer, the gate electrode layer, and the fin connection layer MD similar to those in a single memory cell in each of the bitcell-like dummy cells 206 around the edge memory cells 204. Similarly, in various embodiments, the number of the units within a single dummy cell may depend on the specification or the requirement of the memory array circuit 200.

By arranging the dummy cell 206 depicted in any of FIGS. 4-7 in the memory array circuit 200 at the edge of the memory array 210 (e.g., adjacent to the edge memory cells 204), a non-ideal etching effect, such as under-etching or over-etching, in the fabrication process can be avoided, because the under-etching or over-etching occurs in the inoperative bitcell-like dummy cells 206. Accordingly, the operative edge memory cells 204 on the edge of the memory array 210 are protected. In addition, the dummy cells 206 surrounding the memory array 210 can provide enhanced yield and reduced bit error rate for the memory chip and provide a margin to prevent the under-etching or over-etching while keeping both the edge memory cells 204 and the inner memory cells 202 symmetric in the memory array circuit 200 by mimicking the layout of the memory array 210. Accordingly, the arrangement of the dummy cells 206 may provide a more uniform structure throughout the memory array 210 and thus improve the stability of the edge memory cells 204. Because the read or write performance is dependent on the cell stability, the arrangement of the dummy cells 206 also enhances read or write performance for the edge memory cells 204. In addition, the OTP bitcell-like dummy cell structures depicted in FIGS. 4-7 may also be applied in other non-volatile memory process.

Figure 8:
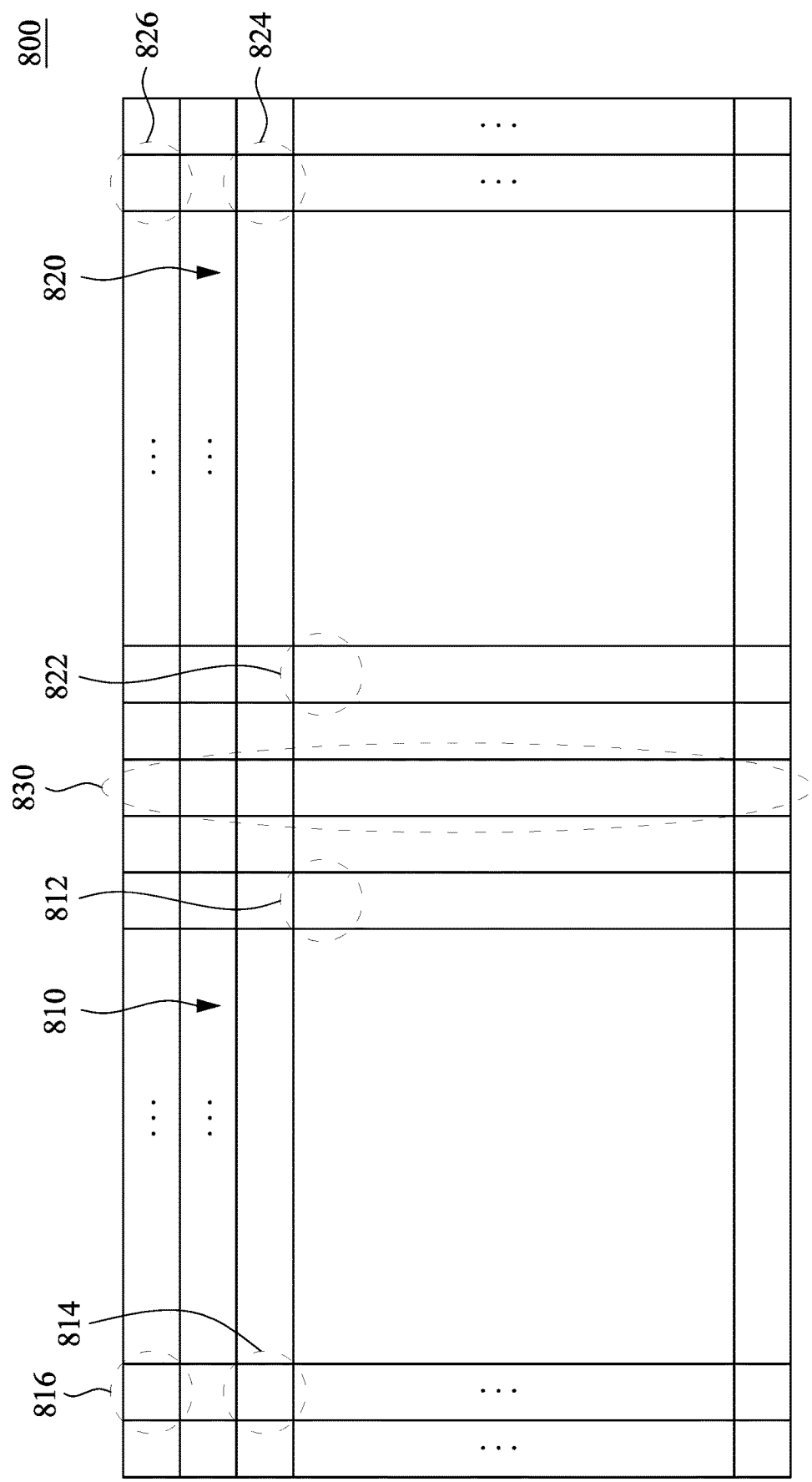
FIG. 8 illustrates another memory array circuit, in accordance with some embodiments of the present disclosure.

FIG. 8 illustrates another memory array circuit 800, in accordance with some embodiments of the present disclosure. Similar to the memory array circuit 200 of FIG. 2, the memory array circuit 800 can also be a non-volatile memory, such as an OTP memory, but the present disclosure is not limited thereto. Compared to the memory array circuit 200 in FIG. 2, the memory array circuit 800 includes multiple memory arrays 810 and 820. In some embodiments, the memory arrays 810 and 820 are memory arrays adjacent to each other, or two sub-arrays of a memory circuit separated by shared dummy cells 830. For example, the bit lines of the memory array 810 can be aligned with respect to the bit lines of the memory array 820, but the present disclosure is not limited thereto.

As shown in FIG. 8, the memory arrays 810 and 820 are separated by dummy cells 830 located between an edge of the memory array 810 and an edge of the memory array 820. The dummy cells 830 can be configured to electrically isolate memory within the memory arrays 810 and 820. The memory arrays 810 and 820 respectively include memory cells 812 and 814, and memory cells 822 and 824 at intersections of rows and columns. Similar to memory cells 202, memory cells 812 and 822 are respectively disposed at an inner area of the memory arrays 810 and 820. Memory cells 814 and 824 are respectively located at one or more edges of the memory array 810 and 820, surrounding the inner memory cells 812 and 822. The structure and operations of inner memory cells 812 and 822 and edge memory cells 814 and 824 are similar to the inner memory cells 202 and the edge memory cells 204 in FIG. 2, and thus detail explanation is not repeated herein for the sake of brevity.

As shown in FIG. 8, a set of dummy cells 816 are arranged to surround the memory array 810 with a set of dummy cells 830 located between the memory arrays 810 and 820. A set of dummy cells 826 are arranged to surround the memory array 820 with the set of dummy cells 830 located between the memory arrays 810 and 820. Accordingly, adjacent memory arrays 810 and 820 share dummy cells 830 located between adjacent edges of the memory arrays 810 and 820. Similar to the dummy cells 206 in FIG. 2, dummy cells 816, dummy cells 826, and dummy cells 830 can be inoperative cells and designed in several ways to strengthen the robustness at the edge of the memory arrays 810 and 820. By sharing the dummy cells 830, the layout area can be reduced, and the area overhead of dummy edge cells can be reduced in the memory chip.

In various embodiments, different types of OTP memory cells may be applied as the unit cell in the memory array circuits 200 and 800 based on the specification of the memory device.

Figure 9A:
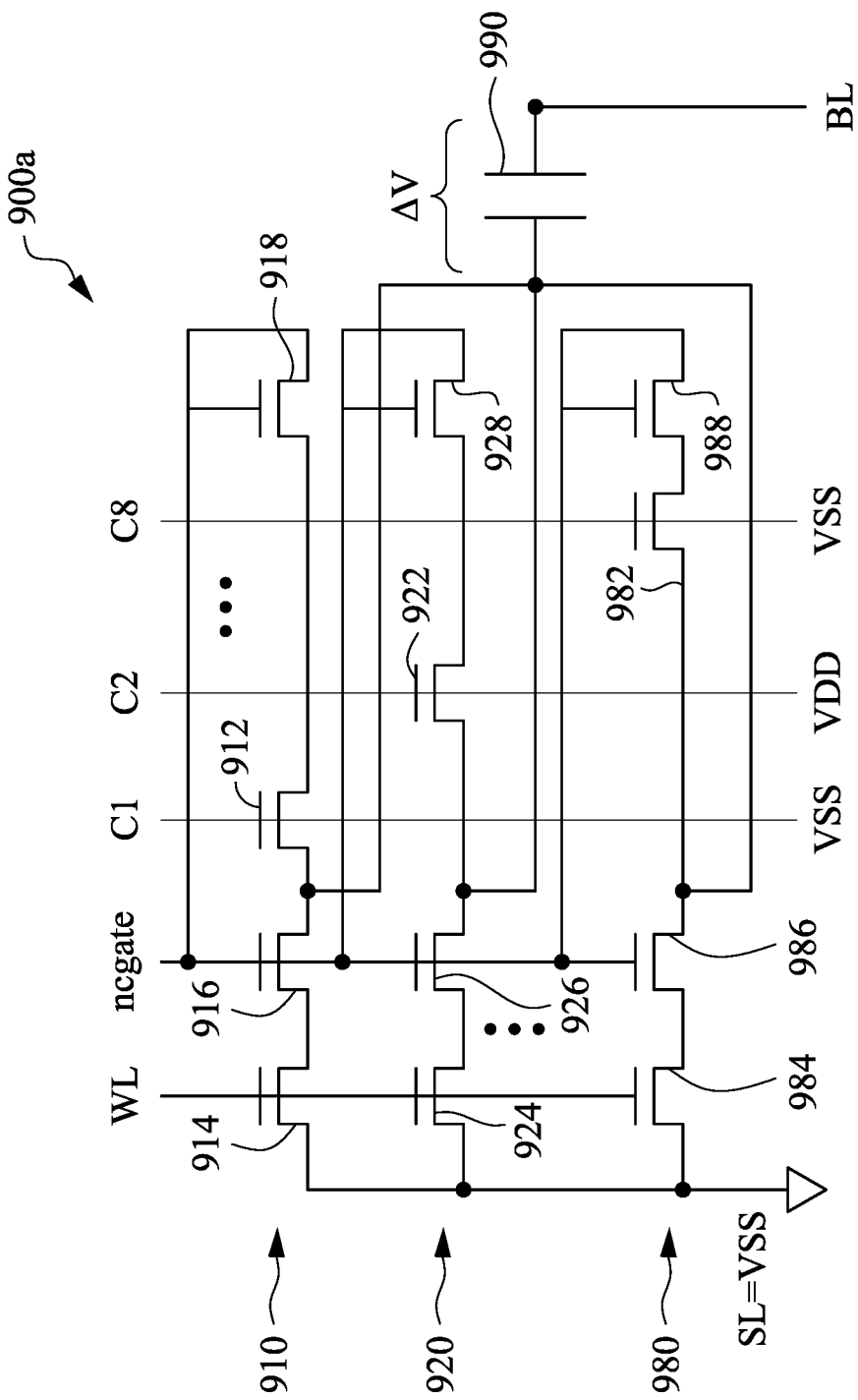
FIG. 9A is a diagram illustrating a second exemplary circuit diagram of a memory cell, in accordance with some embodiments of the present disclosure.

FIG. 9A is a diagram illustrating another exemplary circuit diagram of a memory cell 900a within the memory array circuits 200 and 800, in accordance with some embodiments of the present disclosure. In some embodiments, the memory cell 900a may be used to implement a diode type OTP bit cell. As shown in FIG. 9A, in some embodiments, the memory cell 900a includes N units 910-980 coupled in parallel, in which N may be any positive integer number. For example, the unit 910 includes transistors 912, 914, 916 and 918 coupled in series. Similarly, the unit 920 and the unit 980 each includes transistors 922-928 and 982-988 coupled in series. In some embodiments, the number of units arranged within the memory cell 900a is eight, but the present disclosure is not limited thereto. For example, the number of units may be four, sixteen, or any other practical numbers.

In the unit 910, a gate terminal of the transistor 912 is coupled to a control line C1, in turn coupled to VSS of the memory array circuit, a gate terminal of the transistor 914 is coupled to a word line WL of the memory array circuit, and gate terminals of the transistors 916 and 918 are coupled to a negative control line NCGATE of the memory array circuit. Similarly, in the unit 920, a gate terminal of the transistor 922 is coupled to another control line C2, in turn coupled to VDD of the memory array circuit, a gate terminal of the transistor 924 is coupled to the word line WL, and gate terminals of the transistors 926 and 928 are coupled to the negative control line NCGATE. In the unit 980, a gate terminal of the transistor 982 is coupled to another control line C8, in turn coupled to VSS of the memory array circuit, a gate terminal of the transistor 984 is coupled to the word line WL, and gate terminals of the transistors 986 and 988 are coupled to the negative control line NCGATE. A capacitor 990 is coupled between the bit line BL of the memory array circuit, and a node coupled to the transistors 916, 926 and 986 having their gate terminals coupled to the negative control line NCGATE for receiving a control signal. The select line SL, which may be a control line coupled to ground, is coupled at a node to the transistors 914, 924, and 984. As shown in FIG. 9A, transistors 912, 922 and 982 in each unit, when turned off, can be used to block reverse current flow through the parasitic body diodes of the transistors 918, 928, and 988.

Figure 9B:
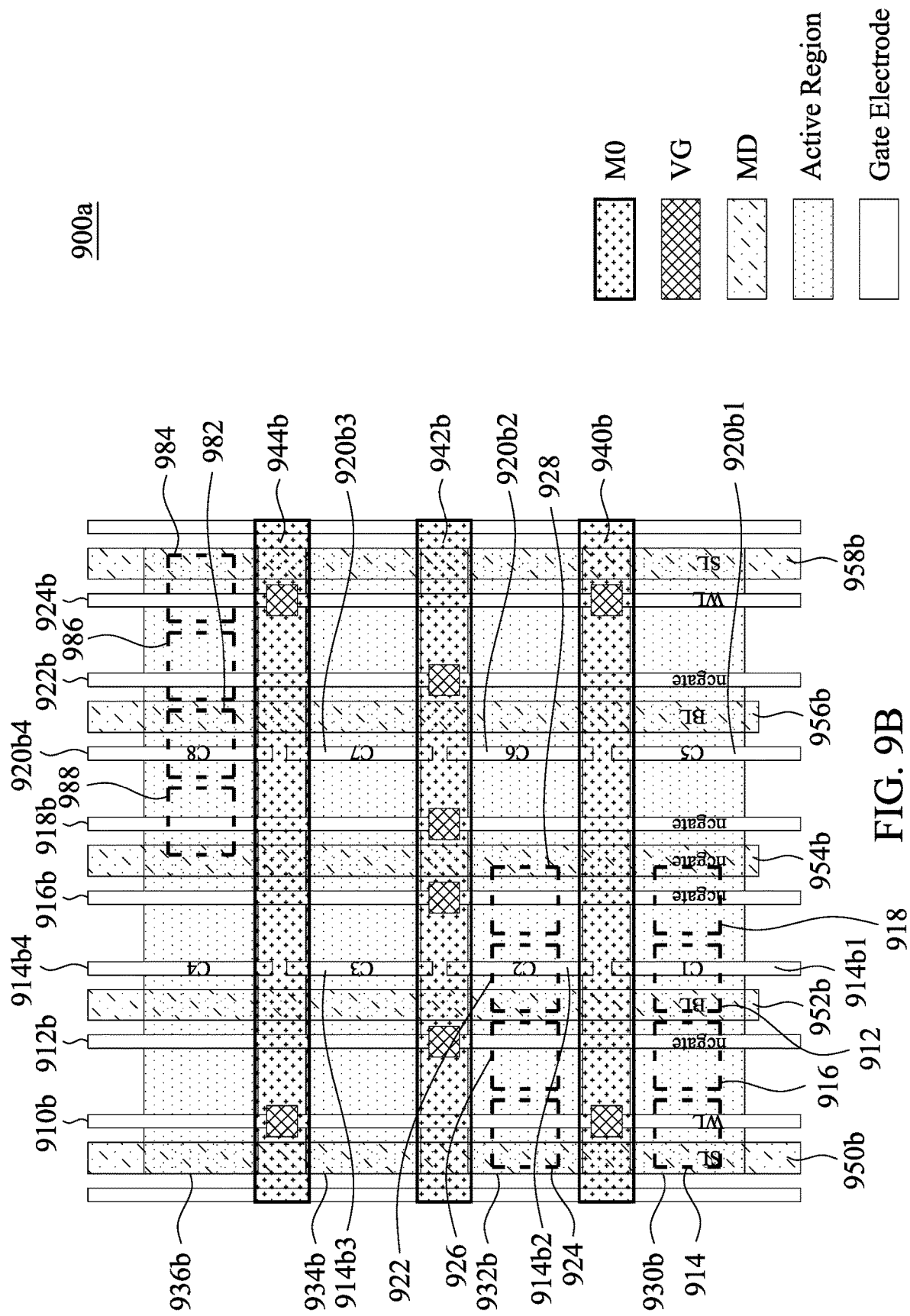
FIG. 9B is an exemplary layout diagram of the memory cell of FIG. 9A, in accordance with some embodiments of the present disclosure.

FIG. 9B is an exemplary layout diagram of the memory cell 900a in FIG. 9A, in accordance with some embodiments of the present disclosure. With respect to the embodiment of FIG. 9A, like elements in FIG. 9B are designated with the same reference numbers for ease of understanding. Components of the memory cell 900a in FIG. 9B, as will be illustrated below, are disposed, in some embodiments, over a semiconductor substrate, which, for convenience of illustration, is not shown in FIG. 9B. In some embodiments, the semiconductor substrate is a silicon substrate or other suitable semiconductor substrate. The memory cell 900a is formed in the gate electrode layer, the OD layer, and the fin connection layer MD described above.

For illustration in FIG. 9B, each of the transistors 912-918, 922-928 and 982-988, of the memory cell 900a is illustrated within a dashed line frame. The memory cell 900a includes gate electrodes 910b, 912b, 914b1-914b4, 916b, 918b, 920b1-920b4, 922b, and 924b, in the gate electrode layer, arranged to form gates of the transistors 912-918, 922-928 and 982-988.

Gate electrodes 910b-924b are shown crossing active regions 930b, 932b, 934b, and 936b in the OD layer. The transistors (e.g., transistors 912-918, 922-928 and 982-988) within the memory cell 900a may be formed at the crossings. Similar to layout diagrams discussed above, a gate dielectric material such as silicon dioxide, is formed over the OD layer and lies under the gate electrodes 910b-924b but is not shown here for convenience of illustration.

As shown in the layout in FIG. 9B, a gate contact layer VG having conductive features is disposed over the gate electrode layer for electrically connecting the gate electrode layer to an upper-level layer such as a local connection layer M0. The fin connection layer MD for electrically connecting source/drain regions of the transistors is disposed over the active regions 930b-936b. In some embodiments, the local connection layer M0 is a metal layer.

Compared to the layout in FIG. 3B, the gate electrodes 914b1-914b4 and 920b1-920b4 respectively correspond to the gates of the eight transistors 912, 922 and 982 in each unit and are respectively coupled to control lines C1-C8, in turn coupled to VSS or VDD of the memory array circuit.

The gate electrodes 910b and 924b are electrically coupled to the word line WL. The gate electrodes 912b, 916b, 918b and 922b are electrically coupled to the negative control line NCGATE. In some embodiments, the layer M0 includes conductive features 940b, 942b, and 944b. As shown in FIG. 9B, in some embodiments, the gate electrodes 910b and 924b may be electrically coupled to the conductive features 940b and 944b of the layer M0 by corresponding vias in the layer VG. In some embodiments, the gate electrodes 912b, 916b, 918b and 922b may be electrically coupled to the conductive feature 942b of the layer M0 by corresponding vias in the layer VG. In some embodiments, the layer MD includes conductive features 950b, 952b, 954b, 956b, and 958b. The conductive features 950b and 958b correspond to the select line SL, the conductive features 952b and 956b correspond to the bit line BL, and the conductive feature 954b corresponds to the negative control line NCGATE. In some embodiments, conductive features 950b-958b are provided within the layer MD along the second direction perpendicular to the first direction.

Figure 10A:
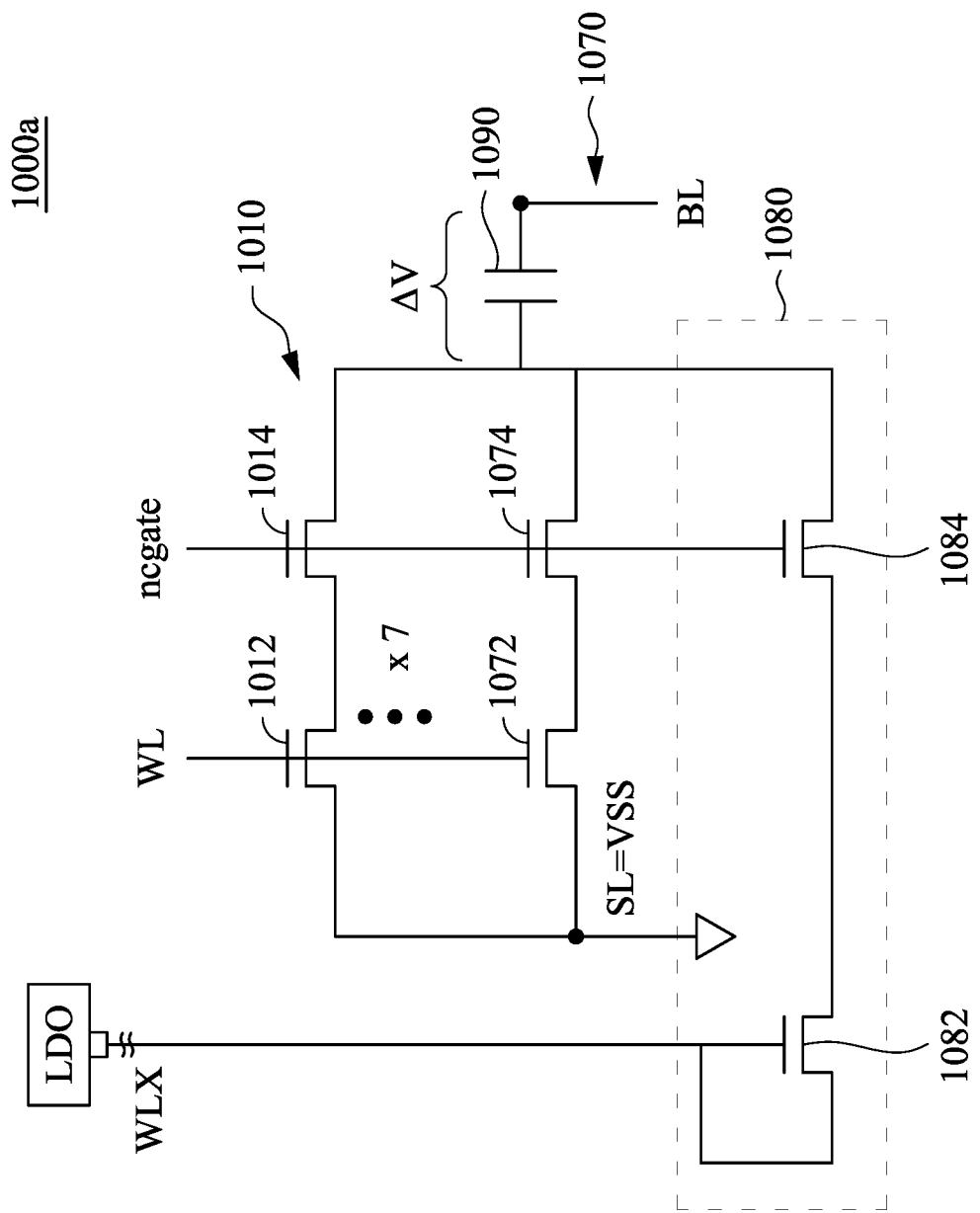
FIG. 10A is a diagram illustrating a third exemplary circuit diagram of a memory cell, in accordance with some embodiments of the present disclosure.

FIG. 10A is a diagram illustrating an exemplary circuit diagram of a memory cell 1000a within the memory array circuit 200 or 800 in accordance with some embodiments of the present disclosure. As shown in FIG. 10A, in some embodiments, the memory cell 1000a includes eight units 1010-1080, in which seven units 1010-1070 are coupled in parallel, and a separate unit 1080 is coupled to a low-dropout regulator LDO to receive an external control voltage via a separated word line WLX. For example, each of the units 1010-1070 includes two transistors 1012 and 1014, . . . , 1072 and 1074 coupled in series. The unit 1080 includes transistors 1082 and 1084 coupled in series. In other embodiments, the number of units arranged within the memory cell 1000a may be four or sixteen, or any other practical number.

In the units 1010-1070, gate terminals of the transistors 1012, . . . , 1072 are coupled to the word line WL of the memory cell 1000a, and gate terminals of the transistors 1014, . . . , 1074 are coupled to the negative control line NCGATE. Similarly, in the unit 1080, a gate terminal of the transistor 1084 is also coupled to the negative control line NCGATE. On the other hand, a gate terminal of the transistor 1082 is coupled to a separated word line WLX different from the word line WL. The word line WLX is coupled to the low-dropout regulator LDO to receive the external control voltage. A capacitor 1090 is coupled between the bit line BL, and a node coupled to the transistors 1014-1084 having their gate terminals coupled to the negative control line NCGATE for receiving a control signal. A select line SL is coupled to a node coupled to the transistors 1012-1072 having their gate terminals coupled to the word line WL.

Figure 10B:
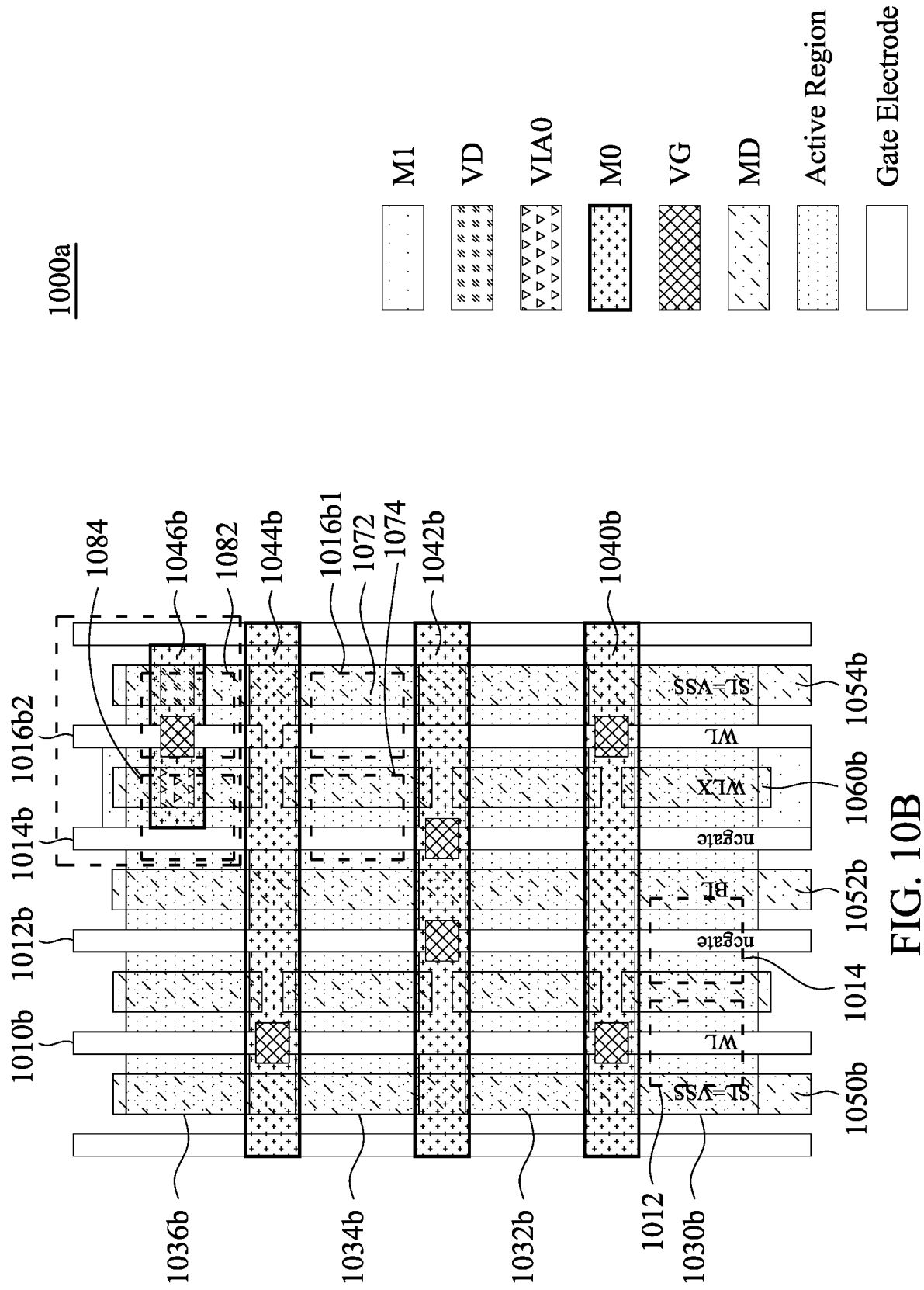
FIG. 10B is an exemplary layout diagram of the memory cell of FIG. 10A, in accordance with some embodiments of the present disclosure.

FIG. 10B is an exemplary layout diagram of the memory cell 1000*a* in FIG. 10A, in accordance with some embodiments of the present disclosure. With respect to the embodiment of FIG. 10A, like elements in FIG. 10B are designated with the same reference numbers for ease of understanding. For illustration in FIG. 10B, each of the transistors 1014-1084 of the memory cell 1000*a* is illustrated within a dashed line frame. The memory cell 1000*a* includes gate electrodes 1010*b*, 1012*b*, 1014*b*, 1016*b*1 and 1016*b*2, arranged to form gates of the transistors 1014-1084.

Gate electrodes 1010*b*, 1012*b*, 1014*b* are shown crossing active regions 1030*b*, 1032*b*, 1034*b*, and 1036*b*. The gate electrode 1016*b*1 is shown crossing active regions 1030*b*, 1032*b*, and 1034*b*, while the gate electrode 1016*b*2 is shown crossing the active region 1036*b*.

The transistors (e.g., transistors 1014-1084) within the memory cell 1000*a* may be formed at the crossings. As shown in the layout in FIG. 10B, the gate contact layer VG having conductive features is disposed over the gate electrode layer for electrically connecting the gate electrode layer to an upper-level layer such as the local connection layer M0. The fin connection layer MD for electrically connecting source/drain regions of the transistors is disposed over the active regions 1030*b*, 1032*b*, 1034*b*, and 1036*b*.

In addition, a contact layer (also known as a via-on-diffusion layer) VD for electrically connecting the fin connection layer MD to the local connection layer M0 is disposed over the fin connection layer MD. A via layer VIA0 for electrically connecting the local connection layer M0 to a metal layer M1 is disposed over the local connection layer M0.

Compared to the embodiments of FIG. 3A and FIG. 3B, the gate electrode 1016*b*2 intersects the active region 1036*b* to form the transistor 1082, with sections on active region 1036*b* corresponding to the source and the drain of the transistor 1082. Accordingly, the gate electrode 1016*b*2 corresponds to the separated word line WLX, while the gate electrodes 1010*b* and 1016*b*1 are coupled to the word line WL for the transistors 1012-1072, and the gate electrodes 1012*b* and 1014*b* are coupled to the negative control line NCGATE for the transistors 1014-1084.

In some embodiments, the layer M0 includes conductive features 1040*b*, 1042*b*, 1044*b*, and 1046*b*. As shown in FIG. 10B, in some embodiments, the gate electrodes 1010*b* and 1016*b*1 may be electrically coupled to the conductive feature 1040*b* and 1046*b* of the layer M0 by corresponding vias in the layer VG. In some embodiments, the gate electrodes 1012*b* and 1014*b* may be electrically coupled to the conductive feature 1042*b* of the layer M0 by corresponding vias in the layer VG. In some embodiments, the layer MD includes conductive features 1050*b*, 1052*b*, and 1054*b*. The conductive features 1050*b* and 1054*b* correspond to the select line SL (e.g., connected to the power supply line VSS), and the conductive features 1052*b* corresponds to the bit line BL. In some embodiments, conductive features 1050*b*-1054*b* are provided within the layer MD along the second direction perpendicular to the first direction.

The gate electrode 1016*b*2 may be electrically coupled to the conductive feature 1046*b* of the layer M0 by one or more corresponding vias in the layer VG. The conductive feature 1046*b* is electrically coupled to the conductive feature 1060*b* of the layer M1 by one or more corresponding vias in the layer VIA0. The conductive feature 1060*b* corresponds to the world line WLX coupled to the low-dropout regulator LDO.

Figure 11A:
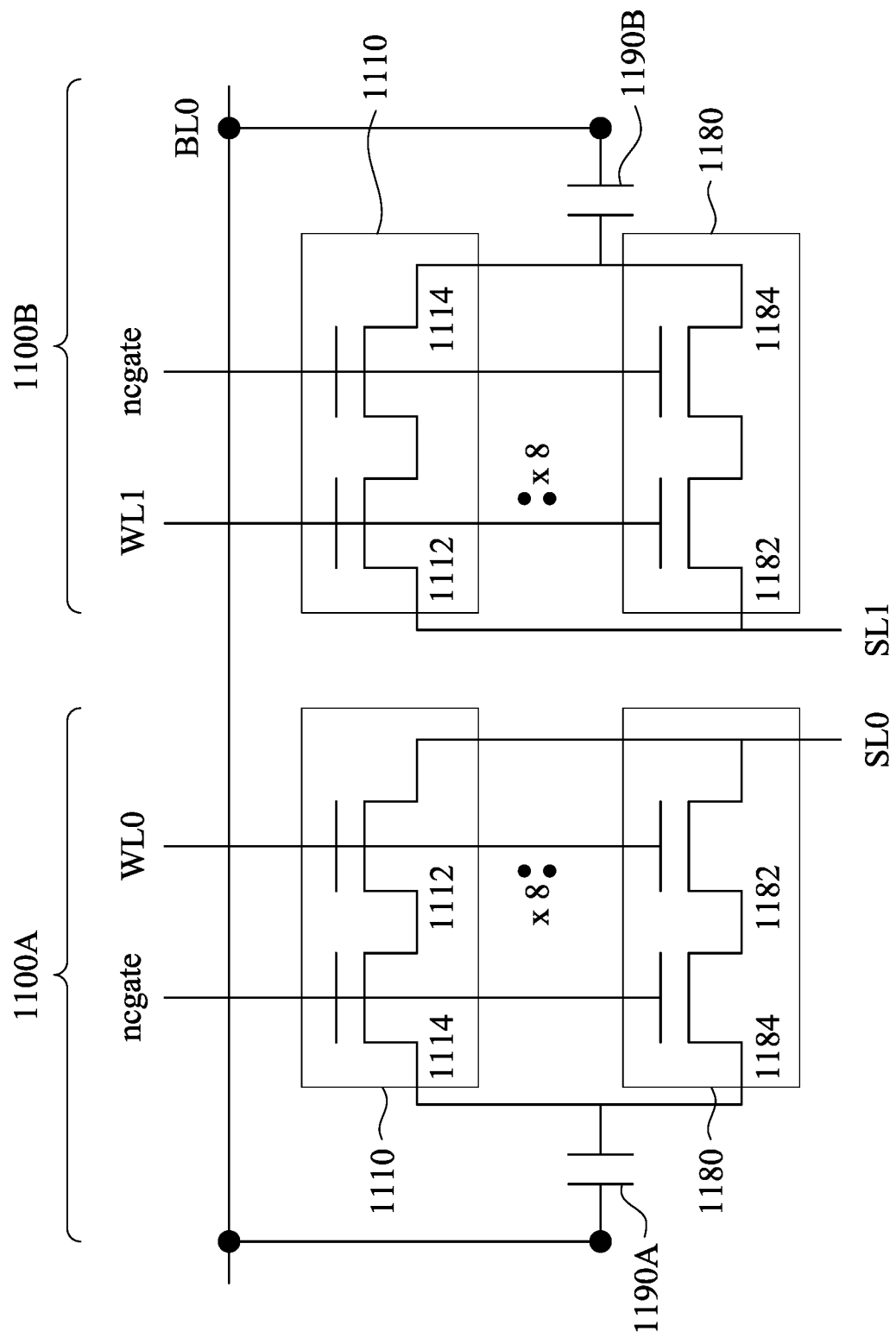
FIG. 11A is a diagram illustrating a fourth exemplary circuit diagram of a memory cell, in accordance with some embodiments of the present disclosure.

FIG. 11A is a diagram illustrating an exemplary circuit diagram of two adjacent memory cells 1100A and 1100B within the memory array circuit 200 or 800, in accordance with some embodiments of the present disclosure. As shown in FIG. 11A, the memory cells 1100A and 1100B are adjacent cells coupled to the same bit line BL0 of the memory array circuit and respective word lines WL0, WL1 of the memory array circuit. Similar to the embodiments above, the memory cells 1100A and 1100B each includes eight units 1110-1180 coupled in parallel, in which each unit includes two transistors (e.g., transistors 1112 and 1114 in the unit 1110, and transistors 1182 and 1184 in the unit 1180) coupled in series. In the memory cells 1100A, gate terminals of the transistors 1112-1182 are coupled to the word line WL0 associated with the memory cell 1100A, and gate terminals of the transistor 1114-1184 are coupled to the negative control line NCGATE. A capacitor 1190A is coupled between the bit line BL, and a node coupled to the transistor 1114-1184 having their gate terminals coupled to the negative control line NCGATE for receiving a control signal. A select line SL0 associated with the memory cell 1100A is coupled to a node of the transistors 1112-1182 having their gate terminals coupled to the word line WL0.

Similarly, in the memory cells 1100B, gate terminals of the transistors 1112-1182 are coupled to the word line WL1 associated with the memory cell 1100B, and gate terminals of the transistor 1114-1184 are coupled to the negative control line NCGATE. A capacitor 1190B is coupled between the bit line BL, and a node coupled to the transistor 1114-1184 having their gate terminals coupled to the negative control line NCGATE for receiving a control signal. A select line SL1 associated with the memory cell 1100B is coupled to a node of the transistors 1112-1182 having their gate terminals coupled to the word line WL1. As shown in FIG. 11A, the memory cells 1100A and 1100B are separated from each other.

Figure 11B:
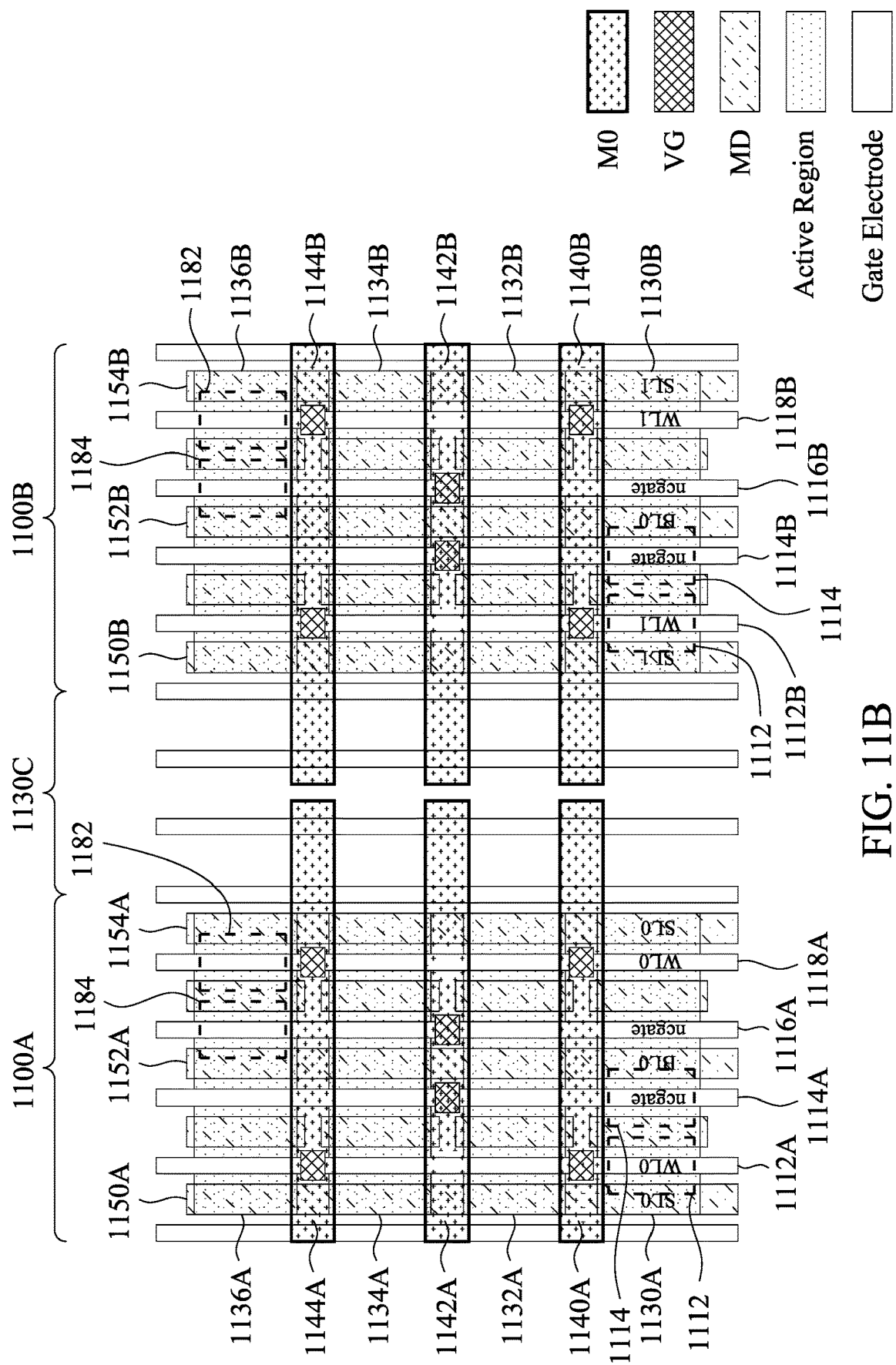
FIG. 11B is an exemplary layout diagram of the memory cell of FIG. 11A, in accordance with some embodiments of the present disclosure.

FIG. 11B is an exemplary layout diagram of the memory cell 1100A and the memory cell 1100B in FIG. 11A, in accordance with some embodiments of the present disclosure. With respect to the embodiment of FIG. 11A, like elements in FIG. 11B are designated with the same reference numbers for ease of understanding. As shown in the layout of FIG. 11B, active regions 1130A, 1132A, 1134A, and 1136A for memory cell 1100A, and active regions 1130B, 1132B, 1134B, and 1136B for memory cell 1100B are separated from each other by a separation region 1130C, forming an OD incoherence structure.

Particularly, gate electrodes 1112A, 1114A, 1116A, 1118A are arranged to form gates of the transistors 1112-1182 within the memory cell 1100A. Gate electrodes 1112B, 1114B, 1116B, 1118B are arranged to form gates of the transistors 1112-1182 within the memory cell 1100B. Similar to the arrangements in FIG. 3B, the gate electrodes 1112A and 1118A are electrically coupled to the word line WL0. The gate electrodes 1112B and 1118B are electrically coupled to the word line WL1. The gate electrodes 1114A, 1116A, 1114B, and 1116B are electrically coupled to the negative control line NCGATE. The layer M0 includes conductive features 1140A, 1142A, and 1144A and 1140B, 1142B, and 1144B. As shown in FIG. 11B, the gate electrodes 1112A and 1118A may be electrically coupled to the conductive feature 1140A and 1144A of the layer M0 by corresponding vias in the layer VG. The gate electrodes 1114A and 1116A may be electrically coupled to the conductive feature 1142A of the layer M0 by corresponding vias in the layer VG. Similarly, the gate electrodes 1112B and 1118B may be electrically coupled to the conductive feature 1140B and 1144B of the layer M0 by corresponding vias in the layer VG. The gate electrodes 1114B and 1116B may be electrically coupled to the conductive feature 1142B of the layer M0 by corresponding vias in the layer VG. The layer MD includes conductive features 1150A-1154A, and 1150B-1154B. The conductive features 1150A and 1154A correspond to the select line SL0, the conductive features 1150B and 1154B correspond to the select line SL1, and the conductive features 1152A and 1152B corresponds to the bit line BL.

Figure 12A:
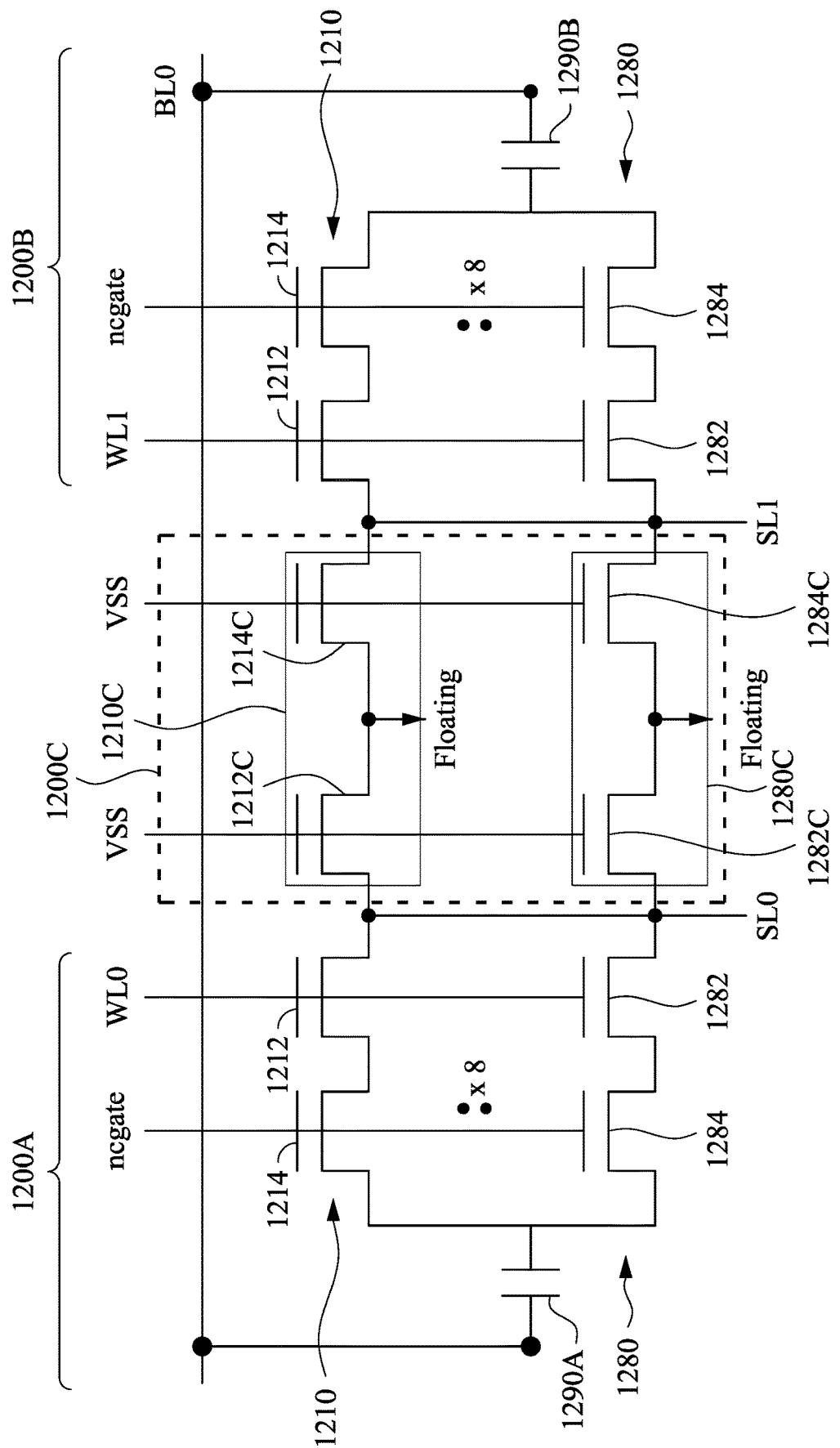
FIG. 12A is a diagram illustrating a fifth exemplary circuit diagram of a memory cell, in accordance with some embodiments of the present disclosure.

FIG. 12A is a diagram illustrating another exemplary circuit diagram of two adjacent memory cells 1200A and 1200B, in accordance with some embodiments of the present disclosure. Similar to FIG. 11A, the memory cells 1200A and 1200B are adjacent cells coupled to the same bit line BL0 and respective word lines WL0, WL1. The memory cells 1200A and 1200B each include eight units 1210-1280 coupled in parallel, in which each unit includes two transistors (e.g., transistors 1212 and 1214 in the unit 1210, and transistors 1282 and 1284 in the unit 1280) coupled in series. In the memory cells 1200A, gate terminals of the transistors 1212-1282 are coupled to the word line WL0 associated with the memory cell 1200A, and gate terminals of the transistor 1214-1284 are coupled to the negative control line NCGATE. A capacitor 1290A is coupled between the bit line BL0, and a node coupled to the transistors 1214-1284 having their gate terminals coupled to the negative control line NCGATE for receiving a control signal. A select line SL0 associated with the memory cell 1200A is coupled to a node of the transistors 1212-1282 having their gate terminals coupled to the word line WL0. Similarly, in the memory cells 1200B, gate terminals of the transistors 1212-1282 are coupled to the word line WL1 associated with the memory cell 1200B, and gate terminals of the transistor 1214-1284 are coupled to the negative control line NCGATE. A capacitor 1290B is coupled between the bit line BL0, and a node coupled to the transistor 1214-1284 having their gate terminals coupled to the negative control line NCGATE for receiving a control signal. A select line SL1 associated with the memory cell 1200B is coupled to a node of the transistors 1212-1282 having their gate terminals coupled to the word line WL1.

As shown in FIG. 12A, a dummy circuit 1200C is coupled between the memory cells 1200A and 1200B. The dummy circuit 1200C also includes eight units 1210C-1280C coupled in parallel, in which each unit 1210C-1280C is coupled between a corresponding pair of units 1210-1280 in the memory cells 1200A and 1200B. Each unit 1210C-1280C includes two dummy transistors (e.g., transistors 1212C and 1214C in the unit 1210C, and transistors 1282C and 1284C in the unit 1280C) coupled, through a floating node, in series. Particularly, gate terminals of the dummy transistors 1212C-1282C, 1214C-1284C are coupled to the power supply line VSS to render the dummy transistors 1212C-1282C, 1214C-1284C inoperative.

Figure 12B:
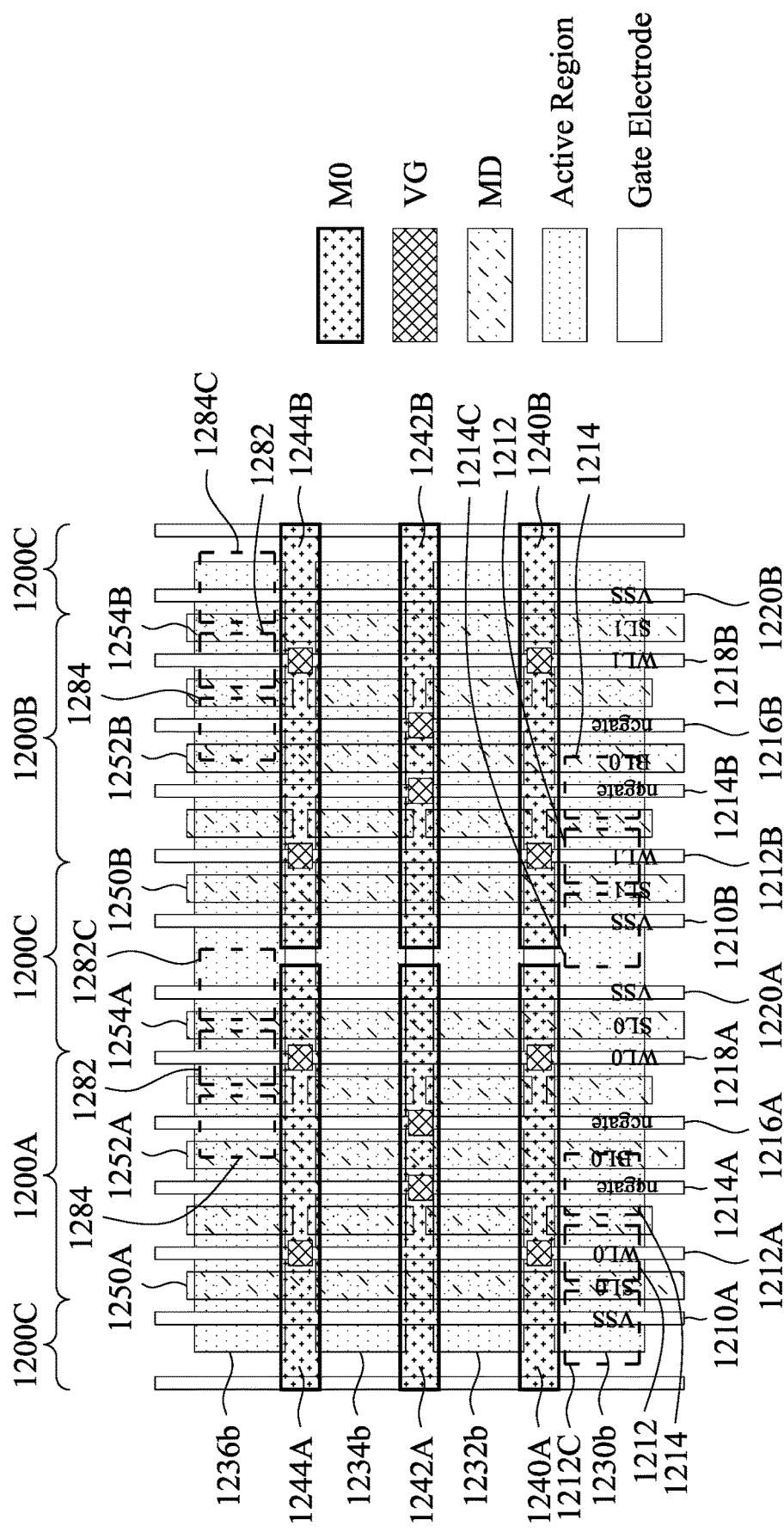
FIG. 12B is an exemplary layout diagram of the memory cell of FIG. 12A, in accordance with some embodiments of the present disclosure.

FIG. 12B is an exemplary layout diagram of the memory cell 1200A and the memory cell 1200B in FIG. 12A, in accordance with some embodiments of the present disclosure. With respect to the embodiment of FIG. 12A, like elements in FIG. 12B are designated with the same reference numbers for ease of understanding. As shown in the layout of FIG. 12B, compared to the layout of FIG. 11B, active regions 1230b, 1232b, 1234b, and 1236b are shared by the memory cells 1200A and 1200B and the dummy transistors in the dummy circuit 1200C, forming an OD coherence structure.

Particularly, gate electrodes 1210A and 1220A are arranged to form gates of the dummy transistors 1212C-1282C coupled to the memory cell 1200A. Gate electrodes 1212A, 1214A, 1216A, 1218A are arranged to form gates of the transistors 1212-1282 within the memory cell 1200A. Gate electrodes 1210B and 1220B are arranged to form gates of the dummy transistors 1214C-1284C coupled to the memory cell 1200B. Gate electrodes 1212B, 1214B, 1216B, 1218B are arranged to form gates of the transistors 1212-1282 within the memory cell 1200B.

Similar to the arrangement in FIG. 3B, the gate electrodes 1210A, 1220A, 1210B and 1220B are electrically coupled to the power supply line VSS. The gate electrodes 1212A and 1218A are electrically coupled to the word line WL0. The gate electrodes 1212B and 1218B are electrically coupled to the word line WL1. The gate electrodes 1214A, 1216A, 1214B, and 1216B are electrically coupled to the negative control line NCGATE.

The layer M0 includes conductive features 1240A, 1242A, and 1244A and 1240B, 1242B, and 1244B. As shown in FIG. 12B, the gate electrodes 1212A and 1218A are electrically coupled to the conductive feature 1240A and 1244A of the layer M0 by corresponding vias in the layer VG. The gate electrodes 1214A and 1216A are electrically coupled to the conductive feature 1242A of the layer M0 by corresponding vias in the layer VG. Similarly, the gate electrodes 1212B and 1218B are electrically coupled to the conductive feature 1240B and 1244B of the layer M0 by corresponding vias in the layer VG. The gate electrodes 1214B and 1216B are electrically coupled to the conductive feature 1242B of the layer M0 by corresponding vias in the layer VG. In some embodiments, the layer MD includes conductive features 1250A-1254A, and 1250B-1254B. The conductive features 1250A and 1254A correspond to the select line SL0, the conductive features 1250B and 1254B correspond to the select line SL1, and the conductive features 1252A and 1252B corresponds to the bit line BL.

FIG. 13 is a flowchart of a method 1300 for fabricating a memory array circuit, in accordance with some embodiments of the present disclosure. It is understood that additional operations may be performed before, during, and/or after the method 1300 depicted in FIG. 13, and that some other processes may only be briefly described herein. The method 1300 can be performed for fabricating the memory circuit or the memory structure illustrated in any of FIGS. 2-12B, but the present disclosure is not limited thereto.

In operation 1310, memory cells (e.g., memory cells 812 and 814 in FIG. 8) of a first memory array (e.g., memory array 810 in FIG. 8) are formed. The memory cells may include inner memory cells (e.g., memory cell 812 in FIG. 8) located in an inner area of the first memory array, and edge memory cells (e.g., memory cell 814 in FIG. 8) located along an edge of the first memory array. Each memory cell may include multiple transistors (e.g., transistors 912-988 in FIG. 9A and FIG. 9B) formed by providing multiple active regions (e.g., active regions 930b-936b in FIG. 9B) and multiple gate structures (e.g., gate electrodes 910b-924b in FIG. 9B) over the multiple active regions. In addition, the transistors can be coupled to one or more corresponding word lines (e.g., word line WL in FIG. 9A), bit lines (e.g., bit line BL in FIG. 9A), control lines (e.g., control line NCGATE in FIG. 9A), select lines (e.g., select line SL in FIG. 9A), and/or power supply lines associated with the memory cell for receiving or outputting corresponding signals. For example, one or more conductive layers (e.g., metal layers) and via layers having conductive features and vias can be provided over the active regions and the gate structures for each memory cell, so as to couple the transistors to the corresponding line(s) to achieve the memory function.

In operation 1320, dummy cells (e.g., dummy cell 816 in FIG. 8) surrounding the first memory array are formed. The dummy cells can be formed by providing one or more active regions (e.g., active region 430 in FIG. 4) and gate structures (e.g., gate electrodes 410-420 in FIG. 4) for each of the dummy cells. In some embodiments, one dummy cell (e.g., dummy cell 206 in FIG. 4) includes a single active region and multiple gate structures over the single active region. In some embodiments, one dummy cell (e.g., dummy cell 206 in FIG. 5) includes two or more active regions and multiple gate structures over each active region. In some embodiments, the number of the active regions within one dummy cell (e.g., dummy cell 206 in FIG. 6 or FIG. 7) is the same or a multiple of the number of the active regions within one memory cell. The one or more active regions may be formed extending in a first direction in a layout of the first memory array, and the gate structures disposed over the one or more active regions may be formed extending in a second direction orthogonal to the first direction.

In some embodiments, the method 1300 further includes operations 1330 and 1340. In operation 1330, second memory cells (e.g., memory cells 822 and 824 in FIG. 8) of a second memory array (e.g., memory array 820 in FIG. 8) are formed, in which the second memory array is adjacent to the first memory array. In operation 1340, second dummy cells (e.g., dummy cell 826 in FIG. 8) surrounding the second memory array are formed. In some embodiments, the dummy cells surrounding the first memory array and the second dummy cells surrounding the second memory array share multiple dummy cells (e.g., dummy cells 830 in FIG. 8) located between the edge of the first memory array and the edge of the second memory array.

By the operations described above, a method for fabricating a memory array circuit can be performed to provide a memory chip with enhanced yield and reduced bit error rate, such as the memory structures illustrated in FIGS. 2-12B. In addition, the disclosed method is compatible in various OTP and non-volatile memory processes and provides a margin to prevent under-etching or over-etching while keeping both the edge memory cells and the inner memory cells in the memory array symmetric. Accordingly, the fabricated memory devices provide better read/write performance in the non-volatile memory. In some embodiments, two adjacent memory arrays may share the inoperative dummy cells between the operative cells to reduce the area overhead, which results in a smaller size and a lower cost of the memory chip.

In some embodiments, a memory array circuit is disclosed that includes a first memory array and a set of dummy cells surrounding the first memory array. The first memory array includes a first set of memory cells located in an inner area of the first memory array and a second set of memory cells located along an edge of the first memory array. Each dummy cell includes one or more active regions and multiple gate structures over the one or more active regions.

In some embodiments, a memory structure is also disclosed that includes memory cells forming a memory array and dummy cells surrounding the memory array. At least one of the memory cells includes active regions extending in a first direction and gate structures disposed over the active regions and extending in a second direction. At least one of the dummy cells includes one or more dummy active regions extending in the first direction, and dummy gate structures disposed over the one or more active regions and extending in the second direction.

In some embodiments, a method for fabricating a memory array circuit is also disclosed that includes forming memory cells of a first memory array; and forming dummy cells surrounding the first memory array, by providing one or more active regions and multiple gate structures. Each of the dummy cells includes the one or more active regions and the multiple gate structures over the one or more active regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array circuit, comprising:
   a first memory array, including:
      a first set of memory cells located in an inner area of the first memory array; and
      a second set of memory cells located along an edge of the first memory array, wherein a first channel length of a first transistor in the first set of memory cells is less than a second channel length of a second transistor in the second set of memory cells; and
   a set of dummy cells surrounding the first memory array, wherein each dummy cell includes one or more active regions and a plurality of gate structures over the one or more active regions, wherein the gate structures in the dummy cells and gate structures of the memory cells have the same width.

2. The memory array circuit of claim 1, wherein the number of the active regions within one dummy cell is the same or a multiple of the number of the active regions within one of the memory cells of the first or second sets of memory cells.

3. The memory array circuit of claim 1, wherein each dummy cell includes a plurality of dummy transistors.

4. The memory array circuit of claim 1, further comprising:
   a second memory array, including:
      a third set of memory cells located in an inner area of the second memory array; and
      a fourth set of memory cells located along an edge of the second memory array;
   wherein the set of dummy cells comprises:
      a plurality of first dummy cells surrounding the first memory array; and
      a plurality of second dummy cells surrounding the second memory array.

5. The memory array circuit of claim 4, wherein the first dummy cells and the second dummy cells share one or more cells located between adjacent edges of the first memory array and the second memory array.

6. The memory array circuit of claim 4, wherein bit lines of the first memory array are aligned with respect to bit lines of the second memory array.

7. The memory array circuit of claim 1, wherein each memory cell includes a predetermined number of transistors.

8. The memory array circuit of claim 7, wherein each memory cell is coupled to a word line of the memory array circuit, by one or more corresponding transistors within the memory cell.

9. The memory array circuit of claim 7, wherein each memory cell is coupled to a select line of the memory array circuit, by one or more corresponding transistors within the memory cell.

10. The memory array circuit of claim 7, further comprising:
one or more dummy transistors located between two adjacent memory cells, the one or more dummy transistors being coupled to one or more corresponding transistors within each of the two adjacent memory cells.

11. A memory structure, comprising:
a plurality of memory cells forming a memory array, wherein a first channel length of a first transistor in a first set of memory cells located in an inner area of the memory array is less than a second channel length of a second transistor in a second set of memory cells located along an edge of the memory array, at least one of the memory cells comprising:
a plurality of active regions extending in a first direction; and
a plurality of gate structures disposed over the plurality of active regions and extending in a second direction; and
a plurality of dummy cells surrounding the memory array, at least one of the dummy cells comprising:
one or more dummy active regions extending in the first direction; and
a plurality of dummy gate structures disposed over the one or more active regions and extending in the second direction, wherein the dummy gate structures and the gate structures of the memory cells have the same width.

12. The memory structure of claim 11, wherein the number of the dummy active regions within one dummy cell is the same or a multiple of the number of the active regions within one memory cell.

13. The memory structure of claim 11, wherein at least one of the dummy cells further comprises one or more conductive layers having one or more conductive features.

14. The memory structure of claim 11, wherein at least one of the memory cells further comprises one or more conductive layers having one or more conductive features coupled to one or more transistors formed by the active regions and the gate structures in the memory cell.

15. The memory structure of claim 11, wherein the memory array comprises:
a first sub-array comprising a plurality of first memory cells;
a second sub-array comprising a plurality of second memory cells; and
a plurality of shared dummy cells located between an edge of the first sub-array and an edge of the second sub-array and configured to separate the first sub-array and the second sub-array.

16. The memory structure of claim 15, wherein bit lines of the first sub-array are aligned with respect to bit lines of the second sub-array.

17. A method for fabricating a memory array circuit, the method comprising:
forming a plurality of memory cells of a first memory array, wherein a first channel length of a first transistor in a first set of memory cells located in an inner area of the first memory array is less than a second channel length of a second transistor in a second set of memory cells located along an edge of the first memory array; and
forming a plurality of dummy cells surrounding the first memory array, by providing one or more active regions and a plurality of gate structures, wherein each of the dummy cells includes the one or more active regions and the plurality of gate structures over the one or more active regions, wherein the gate structures in the dummy cells and the gate structures in the memory cells have the same width.

18. The method of claim 17, wherein the number of the active regions within one dummy cell is the same or a multiple of the number of the active regions within one of the memory cells.

19. The method of claim 17, wherein forming the plurality of dummy cells comprises:
forming the one or more active regions extending in a first direction; and
forming the plurality of gate structures disposed over the one or more active regions and extending in a second direction.

20. The method of claim 17, wherein the memory cells are first memory cells and the dummy cells are first dummy cells, the method further comprising:
forming a plurality of second memory cells of a second memory array adjacent to the first memory array; and
forming a plurality of second dummy cells surrounding the second memory array, wherein the first dummy cells and the second dummy cells share a plurality of cells located between an edge of the first memory array and an edge of the second memory array.

* * * * *